(12) United States Patent
Brandl

(10) Patent No.: US 12,354,762 B2
(45) Date of Patent: Jul. 8, 2025

(54) ION MOVEMENT CONTROL SYSTEM WITH LOW PASS FILTER IN ANALOG SWITCH

(71) Applicant: Infineon Technologies Austria AG, Villach (AT)

(72) Inventor: Matthias Brandl, Munich (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 420 days.

(21) Appl. No.: 17/954,699

(22) Filed: Sep. 28, 2022

(65) Prior Publication Data

US 2024/0105355 A1    Mar. 28, 2024

(51) Int. Cl.
*G21K 1/00* (2006.01)
*H03M 1/74* (2006.01)

(52) U.S. Cl.
CPC ............... *G21K 1/00* (2013.01); *H03M 1/74* (2013.01)

(58) Field of Classification Search
CPC .................................. G21K 1/00; H03M 1/74
See application file for complete search history.

(56) References Cited

U.S. PATENT DOCUMENTS

| | | |
|---|---|---|
| 10,635,990 B1 | 4/2020 | Park et al. |
| 2018/0138920 A1 | 5/2018 | Sharma et al. |
| 2018/0167067 A1 | 6/2018 | Hurrell et al. |
| 2022/0247386 A1 | 8/2022 | Barnes et al. |

FOREIGN PATENT DOCUMENTS

WO    WO-2017168389 A1 *  10/2017    .......... H01J 49/0036

OTHER PUBLICATIONS

Alonso, J. et al., "Quantum Control of the Motional States of Trapped Ions through Fast Switching of Trapping Potentials," New Journal of Physics, The Open Access for Physics, vol. 15, Feb. 1, 2013, 25 pages.
Brandl, M.F., "A Quantum von Neumann Architecture for Large-Scale Quantum Computing," https://arxiv.org/abs/1702.02583, Nov. 2017, 44 pages.
Kim, J. et al., "System Design for Large-Scale Ion Trap Quantum Information Processor," Quantum Information & Computation, vol. 5, Issue 7, 2005, 23 pages.
Stuart, J. et al., "Chip-Integrated Voltage Sources for Control Trapped Ions," Arxiv.org, Cornell University Library, 201 Online Library Cornell University Ithaca, NY, Oct. 16, 2018, 7 pages.

* cited by examiner

*Primary Examiner* — Nicole M Ippolito
(74) *Attorney, Agent, or Firm* — SLATER MATSIL, LLP

(57) ABSTRACT

An ion movement control apparatus with low pass filter switch, including a digital to analog converter (DAC) connected to a first port and enabled to provide a DAC voltage, an electrode element connected to a second port, the electrode element configured to provide an electrical field for controlling a position of an ion, and a filter switch between the first port and the second port and having a filter leg and a bypass leg in parallel, the filter leg having a filter leg switch and a filter portion between the first port and the second port and selectively coupling the first port through the filter leg to the second port to slow a voltage transient of the DAC voltage to the electrode element, and where the bypass leg has a bypass leg switch that selectively couples the first port directly to the second port.

20 Claims, 10 Drawing Sheets

US 12,354,762 B2

ION MOVEMENT CONTROL SYSTEM WITH LOW PASS FILTER IN ANALOG SWITCH

TECHNICAL FIELD

The present disclosure relates generally to a system and method for storing and moving ions in an ion trap, and, in particular embodiments, to a system and method for providing a switching system with filtered switches for an ion movement control system.

BACKGROUND

Generally, ion traps may be used as ion movement control systems in trapped ion quantum computing, with ions used as qubits for computation, and the excitation state of an electron indicating a logical value or logic state. Ions such as barium (Ba), magnesium (Mg), calcium (Ca), beryllium (Be), or the like, may be positively charged, and a single electron in the outer shall of the ion used as the logic element. Two or more ions may be entangled, as changing the state of one qubit causes the entangled qubits to change their state immediately, providing substantial speed and power savings over conventional computing. Additionally, ion traps may be used in atomic clocks, where the internal state of the ion is used as a frequency reference, for example for the definition of a second.

However, ion traps require a well-controlled environment, and precise handling of the ions. Generally, ions in an ion trap are trapped or controlled using a radio frequency (RF) field operating at around 200 volts, and 20 megahertz (MHz). Additionally, ions, like any quantum system, have limited coherence times, requiring rapid handling. However, trapped ions and ion strings are sensitive electric field noise, in particular at the secular motion frequencies. Noise at motional frequencies excites motion of ions, resulting in heating.

SUMMARY

An embodiment apparatus includes a digital to analog converter (DAC) connected to a first port and having circuitry enabled to provide a DAC voltage, an electrode element connected to a second port, the electrode element configured to provide, according to a supplied DAC voltage, an electrical field for controlling a position of an ion, and a filter switch connected between the first port and the second port and having a filter leg and a bypass leg, the filter leg located between the first port and the second port, where the bypass leg is between the first port and the second port in parallel with the filter leg, where the filter leg has a filter leg switch and a filter portion in series between the first port and the second port and is configured to selectively couple the first port through the filter leg to the second port to slow a voltage transient of the DAC voltage to provide a filtered DAC voltage as the supplied DAC voltage to the electrode element, and where the bypass leg has a bypass leg switch between the first port and the second port and is configured to selectively couple the first port directly to the second port provide the DAC voltage as the supplied DAC voltage to the electrode element.

An embodiment apparatus includes a plurality of digital to analog converters (DACs), each DAC of the plurality of DACs having circuitry enabled to provide a respective DAC voltage according to a digital voltage signal from a DAC register, an electrode element including an electrode and a capacitor connected to a port, where the capacitor is connected between the port and a reference voltage, and where the electrode element configured to provide, according to a supplied DAC voltage, an electrical field for controlling movement of an ion, and a first filter switch having a first filter leg connected between a first DAC of the plurality of DACs and the electrode, where the first filter leg has a first filter leg switch in series with a first filter portion, where the first filter portion and the capacitor form a first filter between the first DAC and the electrode, where the first filter leg switch is configured to selectively couple the first DAC through the first filter leg to the electrode, where the first filter is configured to slow a voltage transient of the DAC voltage to provide a filtered first DAC voltage as the supplied DAC voltage to the electrode.

An embodiment method includes providing a first digital to analog converter (DAC) voltage through a filter leg for a first time period to an electrode element of an ion position control element, providing, to the electrode element, for a second time period immediately after the first time period, the first DAC voltage through an unfiltered leg that is in parallel with the filter leg, and controlling movement of an ion through an electrical field provided at an electrode of the electrode element according to the first DAC voltage provided to the electrode element.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
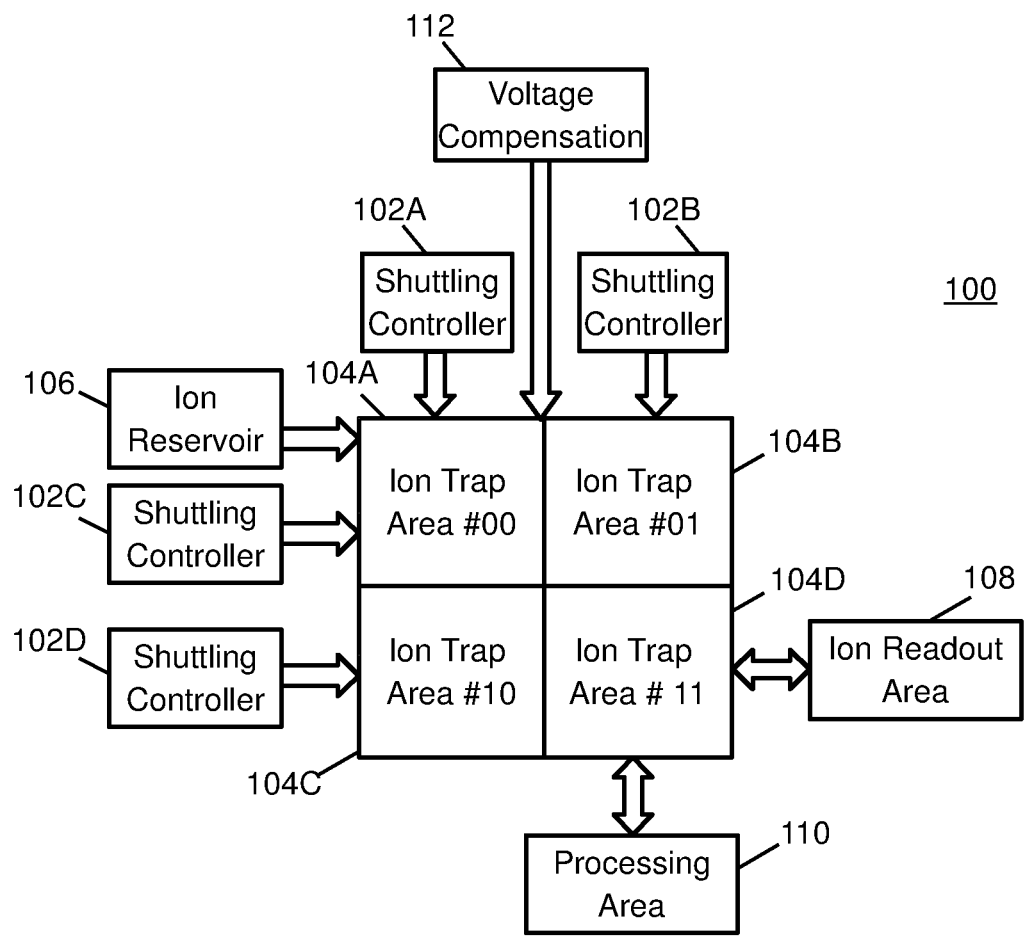
FIG. 1 is a logical diagram illustrating an ion trap system with a shuttling system according to some embodiments.

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. More-over, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Ion trapping is a promising candidate for quantum computing, atomic clocks, and other technologies dependent on isolating single ions. In Penning traps, the ions are confined via a magnetic field and an electrostatic potential. In Paul traps, the ions are confined via an RF-voltage and an electrostatic potential. In a trapped ion quantum computing system, electrostatic potentials are used to move ions between storage and processing locations in a process called ion shuttling. Similarly, electrostatic potentials are used in atomic clocks to trap and control an ion, with properties of the ion used to define the length of a second. In order to control these potentials, hundreds, or even thousands, of electrodes must be simultaneously controlled in order to provide the desired electrical field (E-field). Individualized control of the electrodes requires use of digital-to-analog converters (DACs).

A system for ion shuttling may use a limited number of DACs that are multiplexed to a large number of electrodes in a multidimensional array. A multidimensional ion shuttling system provides for shuttling of multiple ions in multiple different directions simultaneously using the same DACs. The cost and power requirements associated with a one-to-one DAC-to-electrode arrangement is reduced by using the same DACs to control multiple electrodes. Using analog multiplexers (MUX) to reduce the number of controllable voltage sources permits use of fewer DACs. It will not be possible to not have any voltage difference between the two terminals of a MUX. Therefore, a quick closing of the switch will result in a discontinuity of the electric field. Hard switching when turning on DACs or switching between DACs will generate broad spectrum pulses which will lead to ion heating. Thus, zero volt switching (ZVS) may be used for switching MUXs. However, ZVS is not perfectly zero voltage switching, as the transient voltages as the DACs turn off and on are not instantaneous, and a few millivolts difference in voltages when switching between DACs may result in voltage pulsing and resulting ion heating. This is because ion motion in the ion trap is very sensitive to discontinuities, small jumps, of the electric field. It will not be possible to not have any voltage difference between the two terminals of the MUX. Therefore, a quick closing of the switch will result in a discontinuity of the electric field, with a discontinuity being change in voltage/electrical potential that is so fast that the spectral components of this discontinuity overlap with the secular motion frequencies of the ions in the trap. This type of discontinuity potentially leads to motional heating of the ion string, which can be detrimental to TIQC handling. Adding a low pass filter or filter network to a switch to provide a filtered switch permits voltage discontinuities to be minimized or avoided. A filtered switch permits a slow potential equalization or a slow voltage transient through the MUX.

FIG. 1 is a logical diagram illustrating an ion trap system 100 with an ion shuttling system according to some embodiments. The system 100 has one or more ion trap areas 104A-104D that include ion shuttling systems, and which are configured to shuttle ions between target areas such as an ion reservoir 106, ion read-out area 108, and other areas such as ion disposal areas (not shown), processing areas 110, and between the ion trap areas 104A-104D. The system 100 may also have one or more shuttling controllers 102A-102D electrically connected to the ion shuttling systems of the ion trap areas 104A-104D to control movement of the ions. Each of the shuttling controllers 102A-102D may have filtered switches (how shown here) used to filter voltages switched to elements of the ion trap areas 104A-104D.

While the system 100 is illustrated with four ion trap areas 104A-104D and four shuttling controllers 102A-102D, with the ion trap areas 104A-104D in a symmetrical arrangement, the system 100 is not limited to such an arrangement. The shuttling controllers 102A-102D provide addressable voltage control of electrodes, and are, therefore, configured to control any number of cascaded ion trap areas 104A-104D, in any arrangement.

The system 100 may also have a voltage compensation system 112 that provides compensation voltages to individual electrodes in one or more of the ion trap areas 104A . . . 104D. The compensation voltages may, in come embodiments, be provided to compensation electrodes separate from the shuttling electrodes, so that the region of each shuttling electrode may have a DC voltage field applied separate from the field provided by the shuttling controller voltages applied to the respective shuttling electrode. Thus, each shuttling electrode or shuttling electrode set may have one or more associated compensation electrodes. The voltage compensation system may provide voltages at the compensation electrodes to compensate for the deviation from target voltage provided by the DAC when the shuttling or keeping voltage is applied to the shuttling electrodes. Additionally, the compensation system may provide the voltage to the compensation electrodes as an electrostatic voltage by, for example charging a capacitor connected to the compensation electrodes, and then disconnecting the capacitor and compensation electrode from a charging or discharging circuit. When disconnected, the capacitor stays charged for a relatively long time, so that the charge may be periodically adjusted, refreshed, updated or otherwise maintained. This permits many compensation electrodes to be serviced by a single DAC.

Additionally, the voltage compensation system 112 may provide different voltages to a set, or a pair, of compensation electrodes associated with particular confinement or shuttling electrode or group of electrodes, which permits lateral shifting of an ion to align the DC trapping point of the movement fields with the RF trapping point of the ion trapping fields.

Additionally, the shuttling controller 102A-102D may be provided as a unitary controller, with a single controller controlling any number or size of the ion trap areas 104A-104D. The ion trap areas 104A-104D may also be cascaded so that additional ion trap areas 104A-104D and shuttling controllers 102A-102D may be connected to existing ion trap areas 104A-104D and shuttling controller 102A-102D to expand the shuttling area, number of ions controlled, and capabilities of the system 100.

Use of separate, dedicated electrostatic charges for separate compensation electrodes permits a few, or even one, DACs to charge capacitors for a large number of electrodes. The use of electrostatic charges on individual capacitors associated with individual electrodes or sets of compensation electrodes avoids the need to provide a dedicated DAC for each shuttling electrode and avoids the need to use separate DACs to maintain unique voltages across a plurality of shuttling electrodes. The filtering switches may be provided to allow the filtered switches to turn off and on voltages provided by the DACs to the compensation electrodes or shuttling electrodes. Thus, filtered switches may be provided to filter changing in voltages for location control such as ion shuttling by shuttling electrodes or in controlling ion positioning by compensation electrodes.

The system 100 may have a radio frequency (RF) system (not shown) that provides an RF containment field separately from the DC bias of the shuttling electrodes and from the DC fields of the compensation electrodes. The RF field may be provided by electrodes that are separate from electrodes used to provide a shuttling or keeping voltage fields or compensation voltage fields. In some embodiments, the RF field may be operated at around 200 volts, and 20 megahertz (MHz), and the DC fields may be provided locally and separately to shuttle ions being contained by the RF field.

Figure 2:
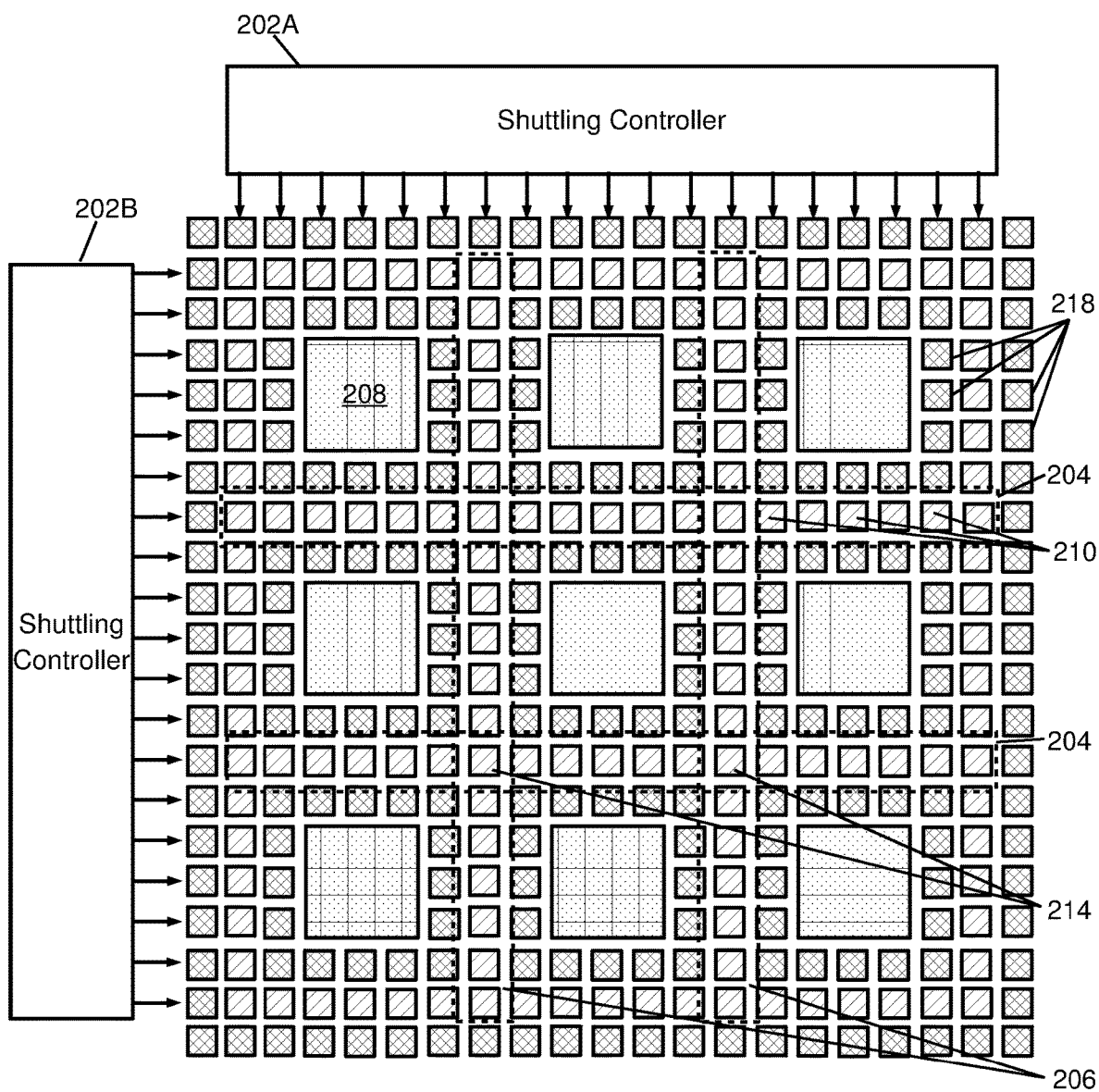
FIG. 2 is a diagram illustrating an ion shuttling system according to some embodiments.

FIG. 2 is a diagram illustrating an ion shuttling system 200 according to some embodiments. The ion shuttling system 200 includes a shuttling controller 202 comprising a first shuttling controller portion 202A and second shuttling controller portion 202B. The first shuttling controller portion 202A and second shuttling controller portion 202B may be connected to a set of confinement or shuttling electrodes 210 arranged in a two-dimensional pattern, or in another arrangement with one dimension, or in three dimensions for layered patterns.

The ion shuttling system 200 may further have a set of auxiliary electrodes such as compensation electrodes 218. The ion shuttling system 200 have also additional electrodes such as RF electrodes (not shown) adjacent to, or between the shuttling electrodes 210 and compensation electrodes 218. In some embodiments, the system 200 may have a lane element (not shown) along which an ion may be shuttled. The shuttling controller 202 provides a direct current (DC) biasing voltage to the shuttling electrodes 210 to move and steer ions along shuttling lanes 204, 206. The shuttling controller 202 provides a voltage to each shuttling electrode 210, and the provided voltage may be connected though a filtering switch so that the voltage is filtered as it is turned on. The voltage at each shuttling electrode 210 may be set or held by a latch associated with the shuttling electrode 210. Using a latch, rather than a DAC, at each shuttling electrode 210 permits for a lower component count, as the DAC requires a far greater number of components than a latch. Scaling up the number of electrodes while using a limited number of DACs permits greater density and higher electrode counts while simplifying production of the ion shuttling system 200.

The shuttling controller 202 may address an individual electrode element, which includes the latch and shuttling electrode 210 itself, and may provide a voltage signal or other signal to set the voltage for a particular shuttling electrode 210, which is held by the shuttling electrode's 210 associated latch. Thus, the voltage of each shuttling electrode 210 may be set individually, and is maintained until reset or changed. In some embodiments, the shuttling controller 202 addresses the individual shuttling electrodes 210 using an electrode control or addressing system, which controls application of a voltage to the shuttling electrodes 210. Thus, the shuttling electrode 210 in a particular column and row may have a shuttling voltage that is set by routing a voltage controlled by a DAC to a latch or storage element, such as a capacitor for the respective shuttling electrode 210, so that the electrode latch or storage element sets the voltage at the shuttling electrode 210.

In other embodiments, an RF field generated by voltages applied to the RF electrodes may hold an ion in controlled position relative to the electrodes, or over a lane element, where present. The DC shuttling field provided by the shuttling electrodes 210 causes the ion to move along the electrodes or lane elements, and filtering the voltages applied to the shuttling electrodes 210 as each voltage is turned on, provides for a smoother voltage profile with reduced discontinuities. In some embodiments, movement or shuttling of the ion is performed by setting a DC voltage on an electrode to create DC bias in the E-field, with the DC bias allowing control of the position of an ion along, or parallel to, the lane 204. Changing the voltage on the shuttling electrodes 210 permits control of the movement of the ion, and ions may be moved along shuttling lanes 204, 206. The shuttling lanes 206, 204 may be arranged so that shuttling lanes 204, 206 cross to form intersections 214 to allow for switching an ion onto different shuttling lanes 204, 206 for two dimensional movement. The shuttling electrodes 210 may be arranged so that free space is created between the shuttling electrodes 210, and shield elements 208 may be provided to shield the shuttling electrodes 210 and ions located in shuttling lanes 204, 206, from voltages provided for other ions in other locations along the shuttling lanes 204, 206. Such an arrangement may reduce cross-talk between ions in the ion shuttling system 200 and simplify production of the ion shuttling system 200. Additionally, while the shuttling lanes 204, 206 and shuttling electrodes 210 are arranged in FIG. 2 in a symmetrical pattern, the shuttling electrodes 210 and shuttling lanes 204, 206 are not limited to such an arrangement, as any arrangement in two dimensions may be provided, including an arrangement where shuttling lanes 204, 206 intersect or cross at non-right angles. Shuttling lanes 204, 206 are not limited to crossing each other, as the shuttling lanes 204, 206 may form a three way, or 'T' intersection, or may form a turn or angle, such as an 'L' shaped intersection.

The voltages provided to the shuttling electrodes 210 may be provided by DACs that provide a voltage or voltage profile to one or more shuttling electrodes 210. However, as the ion moves past shuttling electrodes 210, different voltage profiles from different DACs may be needed on a particular electrode. This can be performed by using multiplexers or other switching or addressing to switch DACs supplying the voltage to a particular shuttling electrode 210. Connecting DACs to different shuttling electrodes 210 and switching DACs that are connected to a particular electrode may result in discontinuities in the voltage at a particular electrode, and may result in discontinuities in the E-field used to move or control position of an ion. A filtering switch between the DAC and the shuttling electrode 210 filters out high frequency transients in the voltage at the electrode to reduce or avoid discontinuities in the E-field. In some embodiments, a filter switch may include a resistor or low pass filter to filter or slow the voltage transition. Additionally, in some embodiments, the filter switch may include a bypass leg that bypasses the filter, so that the filter may be connected between a DAC and a shuttling electrode 210 during a voltage change or transition, and then the bypass leg may be connected between he DAC and the shuttling electrode 210 so that intentional changes in the DAC output voltage may be accurately transmitted to the shuttling electrode 210.

Figure 3A:
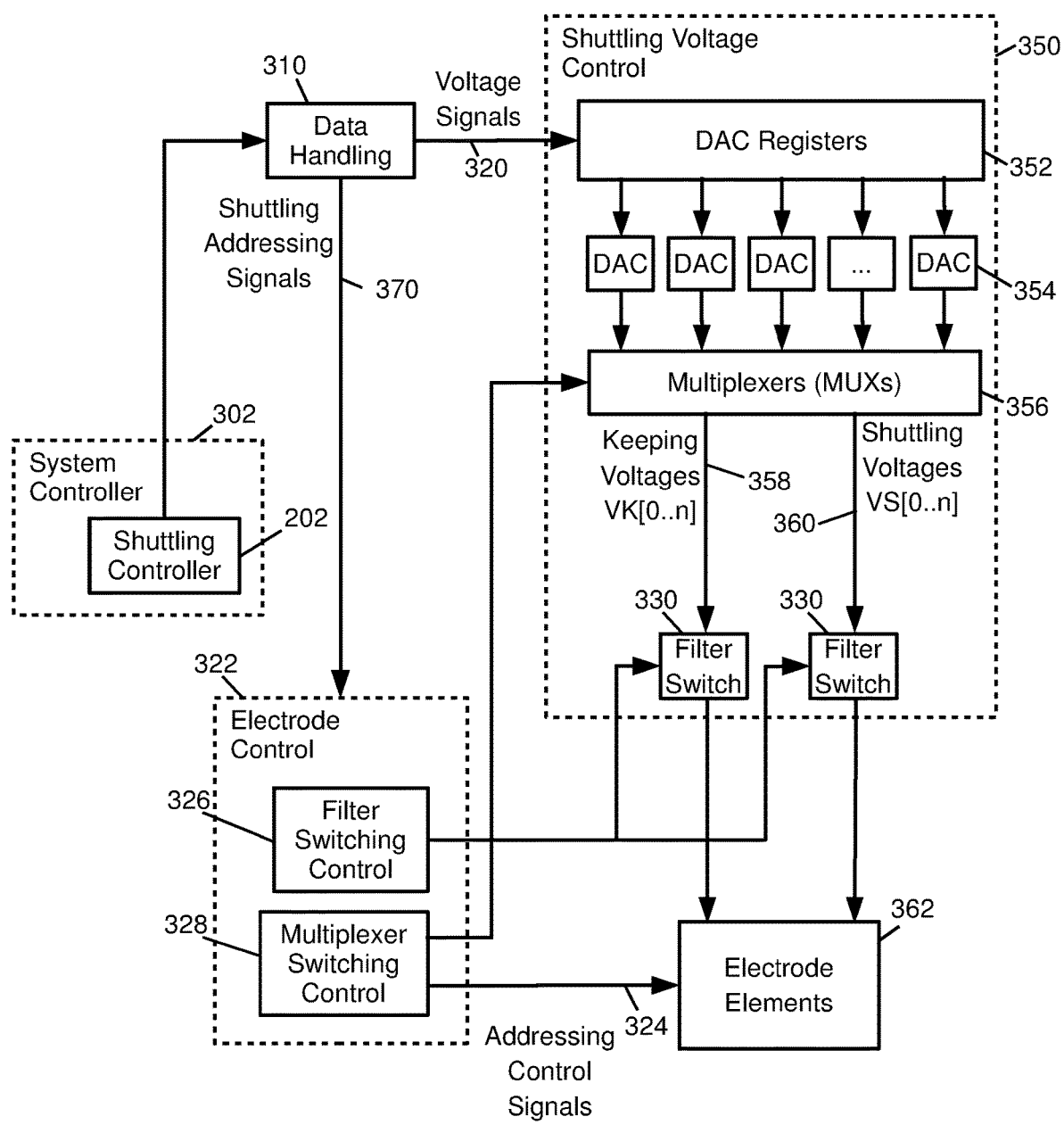
FIG. 3A is a diagram illustrating an ion shuttling control with filtered switches according to some embodiments.

FIG. 3A is a diagram illustrating an ion shuttling control system 300 according to some embodiments. The ion shuttling control system 300 may have a data handling element 310 that receives data from a shuttling controller 202 of a system controller 302, and provides voltage signals 320 or data values to a shuttling voltage control 350 and addressing signals or values to an electrode control 322. The voltage control 350 generates voltages from the data values, and the voltages applied to electrode elements 362 are used to create the E-field at the electrodes. A multiplexer switching control 328 of the electrode control 322 provides addressing control signals 324 to the electrode elements 362 to activate particular electrode 362 elements to load or set the voltage provided by the voltage control 350. A filter switching control 326 provides signals to filter switches 330 to control the voltages 358, 360 provided to the electrode elements 362.

In some embodiments, the shuttling controller 202 may indicate ion control information to a data handling element 310. The ion control information may, in some embodiments, such as a location for an ion within an ion trap, one or more voltages or voltage profiles for one or more electrodes, data indicating a path for ion movement or the like. Thus, the shuttling controller 202 may determine where a shuttling electrode group is located, and may identify or provide information for identification of the shuttling electrode group or shuttling electrodes or electrode elements. Additionally, the shuttling controller 202 may provide information for a shuttling voltage or the like, so that the system may determine shuttling voltages for controlling ion movement.

The data handling element 310 may receive, and in some embodiments, decode, ion control information from the shuttling controller 202. The ion control information may include, for example, one or more voltage values and associated addresses, and the data handling element 310 may determine the column and row of a shuttling electrode to be addressed and set with the associated voltage, and may provide shuttling addressing signals 370 to the electrode control 322, and provide an ion movement control voltage to the shuttling voltage control 350. The ion movement control voltage may, in some embodiments, be a confinement or keeping voltage, that is part of a neutral voltage profile that holds an ion in a location, or may be a shuttling voltage that is part of a shuttling voltage profile used to move, or shuttle, an ion between locations.

In some embodiments, the voltage values may include information, data, or values for a neutral voltage profile for holding an ion on a particular location, or include information, data or values for shuttling voltages for a voltage profile such as a shuttling voltage profile for moving an ion between shuttling electrodes. In some embodiments, a neutral voltage profile may be different from a shuttling voltage profile, with a symmetrical or simpler voltage profile since an E-field gradient needed to maintain an ion in a fixed location requires less shaping than an E-field gradient that would cause an ion to move in a desired direction. Additionally, in some embodiments, the voltages may be keeping voltages for maintaining a base, default, or standard bias voltage against which the neutral voltage profiles or shuttling voltage profiles are changed to provide a localized E-field gradient to trap or control the ions.

In some embodiments, the ion control information may include an explicit address for a particular associated voltage level, and the ion control information may indicate explicit addresses and voltages for each electrode being set for a particular voltage profile. The voltage level may be indicated as an explicit voltage level as an integer or real number, such as +7.2 volts. In other embodiments, the voltage level may be indicated by an index that determines the voltage level from a predetermined formula, table, or the like. For example, the voltage may be indicated by an index of 4, which may be used to reference a table indicating a desired voltage value of +7.0 v, or may be used in a calculation to determine the desired voltage, for example, by multiplying the index by a voltage factor to determine the desired voltage level.

In other embodiments, the ion control information may define a voltage profile and a base location. A voltage profile may indicate a type of movement, type of voltage profile, or the like, and the voltages for multiple electrodes that would be determined to provide the voltage profile may be predefined. For example, a voltage profile may have predetermined voltages for electrodes, with a first electrode pair at +6v, a second electrode pair at +2v, a third electrode pair at +4v, and a fourth electrode pair at +7v, the ion control information may describe an address for one or more of the electrode pairs, and the voltage for each electrode pair of the voltage profile may be determined based on the electrode pair's relative location to address based on the predetermined voltages for the voltage profile. In another embodiment, the ion control information may also describe a movement direction for the voltage profile so that an asymmetric voltage profile may be oriented correctly. In some embodiments, the ion control information may also include a path, speed or movement profile for the ion so that a voltage may be set by the decoder based on a time function, with, for example, new electrode voltages being set every second to move the voltage profile or change the voltages, causing the ion to move along the identified path or in the identified direction.

In some embodiments, the voltage control 350 comprises DAC registers 352, DACs 354, one or more multiplexers (MUXs) 356 and one or more filter switches 330. The DAC registers 352 hold voltage values for the DACs, and the DACs convert digital voltage values to analog voltage values or signals. The DAC registers 352 may be used to hold the voltages long enough for the DACs 354 to propagate an analog voltage through themselves and through the multiplexers 356 to be provided to by the electrode elements 362. The analog voltage values may be sent to multiplexers 356 that receive addressing information to route particular voltages to particular columns of electrode elements 362. Each DAC 354 may be set with a keeping voltage or shuttling voltage, so that, for example, an entire row, column, segment of columns or rows may be set. Setting a single row, column, row segment or column segment of the electrodes permits a limited number of DACs 354 to be used, as the DACs 354 may be reused to set another group of electrodes.

In some embodiments, the multiplexers 356 may be analog multiplexers that pass on analog voltages rather than simply providing digital output levels. Additionally, the analog multiplexer may be configured to allow selection of an analog shuttling voltage and selection of a keeping voltage for a plurality of electrodes.

The multiplexer switching control 328 of the electrode control 322 may provide a control signal that selects one or more DACs 354 used to provide one or more voltages to selected electrode elements 362. In some embodiments, the multiplexers 356 may selectively provide a shuttling voltage VS 360 selected from a plurality of shuttling voltages VS 360 on a first output for a particular electrode column, and a keeping voltage VK 358 or neutral voltage selected from a plurality of keeping and neutral voltages on a second output for the particular electrode column. Providing both the shuttling voltage VS 360 and the keeping voltage VK 358 to a particular electrode permits the shuttling voltage VS 360 and keeping voltage VK 358 to be set to separate values, with an electrode enable signal ESEL provided to the electrode element 362 to be used to select between the shuttling voltage VS 360 and keeping voltage VK 358 for application to the electrode, and also allows each electrode in a group to be selectively set to the shuttling voltage VS 360 or keeping voltage VK 358 using the electrode enable signal. Additionally, the multiplexers 356 may be configured to receive a plurality of different shuttling voltages VS 360 from a first plurality of the DACs 354, and provide at least one of the different shuttling voltages VS 360 to one or more outputs associated with the different electrode column. Thus, a DAC 354 may provide a shuttling voltage VS 360 that is used to set electrode elements 362 in different columns, reducing the number of DACs 354 required to set a great number of electrode elements 362. This may be achieved by setting different DACs to the different voltages required for a shuttling voltage profile, and using the DAC 354 to provide the required voltages for the different electrodes, rather than having a single DAC associated with electrode in a group, and potentially setting multiple DACs with the same voltage. Similarly, another DAC 354 may provide a keeping voltage VK 358 used to set a voltage in multiple electrodes, reducing the number of DACs 354 needed.

In some embodiments, the electrode control 322 receives the shuttling addressing signals 370 indicating which electrodes are activated and further indicating which electrodes are shuttling electrodes, namely electrodes that are assigned to have a voltage that is part of a shuttling voltage profile.

The filter switches 330 may be used to connect or disconnect the multiplexers 356 from the electrode element 362 so that the voltages 358, 360 generated by the DACs 354 may be filtered as the voltages 358, 360 are connected to the electrode elements 362. In some embodiments, each of the filter switches 330 has a filter that filters the voltages 358, 360 for at least a settling time period after the filter switch 330 is closed to connect a multiplexer 356 to an electrode element 362. The filter switching control 326 sends filter switch control signals to the filter switches 330 to control the filter switches to close and connect the multiplexer 356 to the electrode elements 362, or to open to disconnect the multiplexers 356 from the electrode elements 362. In some embodiments where filter switches 330 solely have a filter leg, the filter switching control 326 may control the filter switches 330 to close, and the control of the filter switches 330 may be timed or controlled in relation to the control of the multiplexers 356 so that the filter switches close after the DAC voltage is set. In some embodiments, the filter switching control 326 sends signal to time closing or opening of different portions of each filter switch 330. For example, each filter switch 330 may have a filter leg and a bypass leg, and the filter switching control may close a filter leg to filter the voltages 358, 360 supplied by the DACs 354, then may tie the closing of the bypass leg to directly connect the DACs 354 or multiplexers 356 to the electrode elements 362 after a setting period or predetermined time. This results in the initial voltage connection to the electrode elements 362 being a filtered voltage for an initial time, and so the voltage after the initial time period being an unfiltered voltage.

Figure 3B:
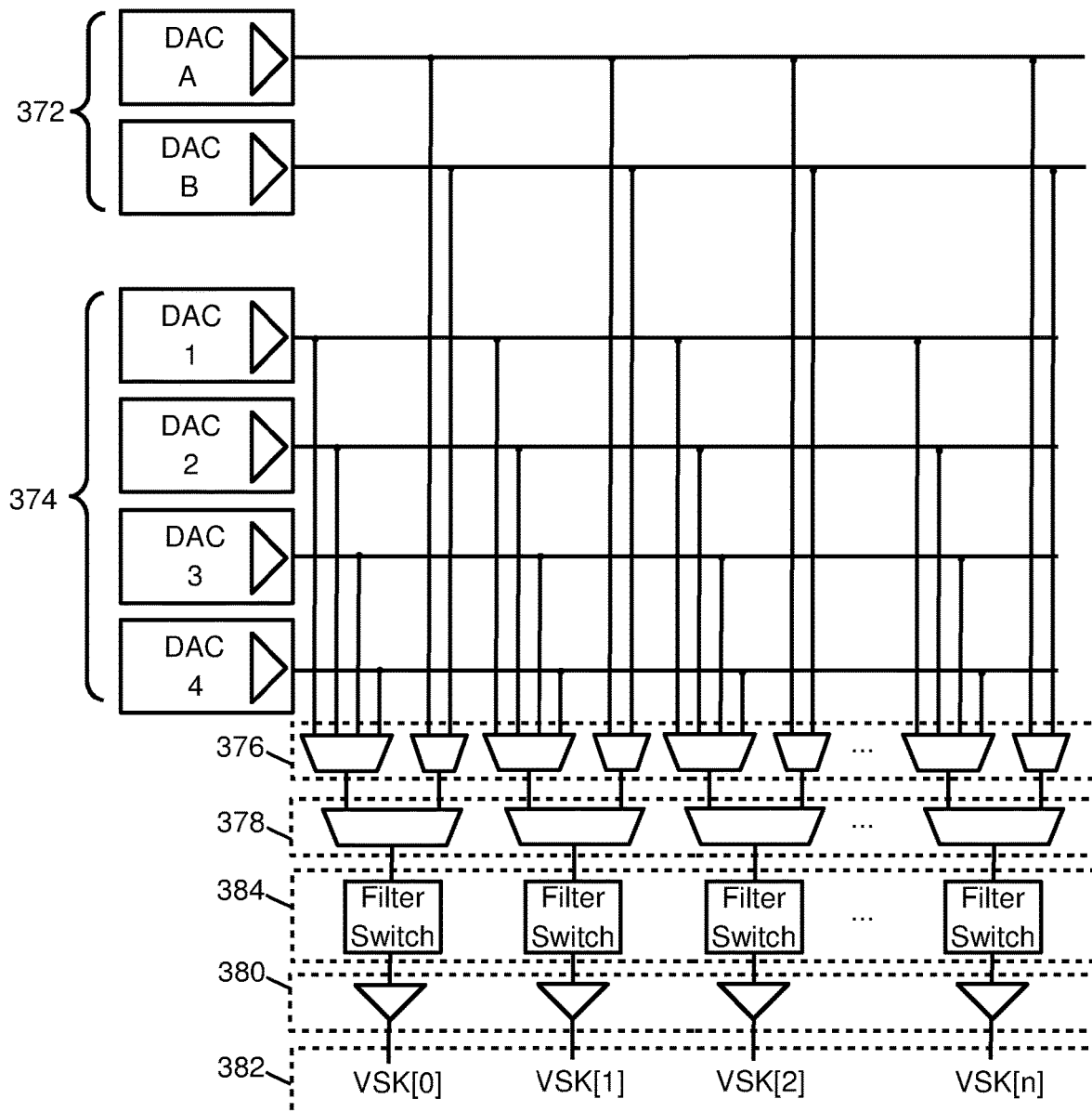
FIGS. 3B-3C are diagrams illustrating analog multiplexer arrangements with filtered switches for an ion shuttling control system according to some embodiments.

FIG. 3B is an analog multiplexer 371 for an ion shuttling control system according to some embodiments. The analog multiplexer 371 routes or connects DACs 372, 374 to electrode elements by selectively passing output signals from DAC 372, 374 as shuttling voltages VS[0 . . . n] and keeping voltage VK[0 . . . n], which are then routed to the selected electrode. The analog multiplexer 371 may have a plurality of line multiplexers 376 that multiplex signals from a plurality of DACs 372, 374. The DACs 372, 374 may include a plurality of keeping voltage DACs 372 and a plurality of shuttling voltage DACs 374. The line multiplexers 376 provide output signals 382 to different lines, or sets of electrodes, and may include a plurality of shuttling voltage multiplexers and a plurality of keeping voltage multiplexers. Additionally, in some embodiments, each line multiplexer 376 provide an output signal 382 through a filter switch 384, a buffer 380, or through one or more other elements for processing, handling, manipulating or modifying the output signal 382.

Selection multiplexers 378 may be provided to select between providing a keeping voltage VK[0 . . . n] or shuttling voltage VS[0 . . . k] to each output line. Each shuttling voltage multiplexer is connected to a plurality of the shuttling voltage DACs 374, and may be switched to provide a shuttling voltage VS[0 . . . n] to a plurality of different electrodes by connecting a selected one of the shuttling voltage DACs 374 to one or more electrodes. Similarly, each keeping voltage multiplexer is connected to a plurality of the keeping voltage DACs 372, and may be switched to provide a keeping voltage VK[0 . . . n] to a plurality of different electrodes by connecting a selected one of the keeping voltage DACs 372 to one or more electrodes. The electrodes may then be activated and selected to turn on the electrode and cause the electrode to use the provided shuttling voltage VS[0 . . . n] or the provided keeping voltage VK[0 . . . n].

The filter switches 384 may be included as part of the analog multiplexer circuit 371 and used to filter out transitions between different DACs 372, 374, or turning off a DAC 374, 374. The filter switches 384 may operate in response to filtering or switching commands from, for example, a filter switching control.

Figure 3C:
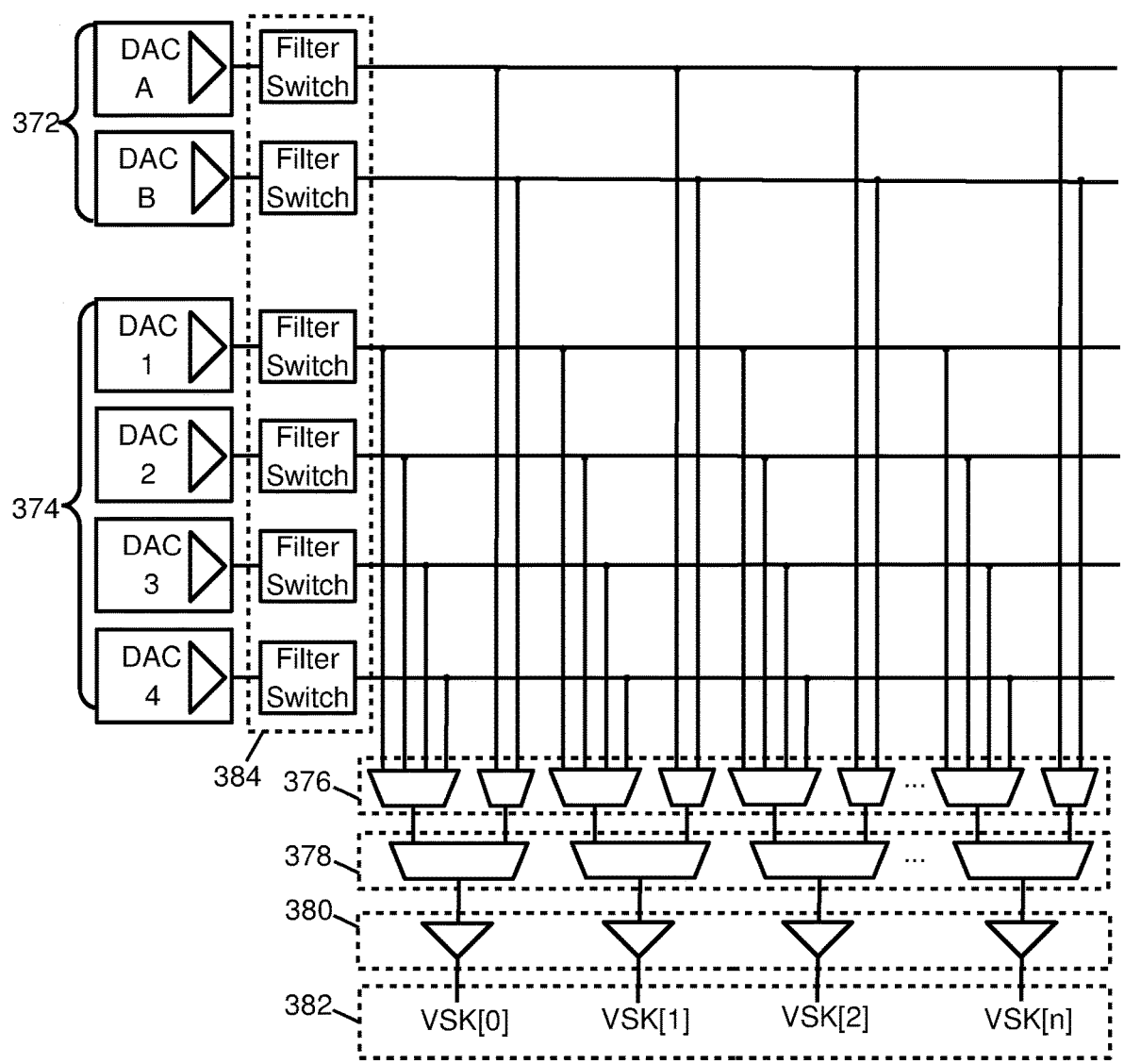

FIG. 3C is an analog multiplexer 383 for an ion shuttling control system according to some embodiments. The analog multiplexer 383 may have an arrangement similar to the analog multiplexer 371 of FIG. 3B, but with filter switches 384 be located between the DACs 372, 3714 and the line multiplexers 376. This arrangement permits a single filter switch 384 to be associated with each DAC 374, 372, permitting each DAC signal to be filtered as the respective DAC 372, 374 is turned on or off.

Figure 4A:
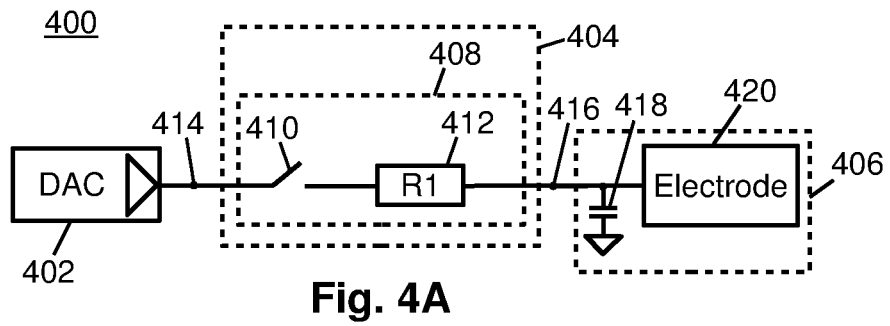
FIG. 4A is a diagram illustrating a filtered switch system according to some embodiments.

FIG. 4A is a diagram illustrating a filtered switch system 400 according to some embodiments. In an embodiment system using a filter switch 404, the filter switch 404 may be located between a DAC 402 and an electrode element 406. While the filter switch 404 is shown being directly connected between the DAC 402 and electrode element 406, this arrangement is merely exemplary, and is not intended to be limiting, as the filter switch 404 may be used with other elements, such as multiplexers, filters, buffers or other switches, addressing systems, or the like, located between the filter switch 404 and the DAC 402 or electrode element 406. Slow potential equalization between a DAC 402 and electrode element 406 can be done with a resistor in series to the electrode 420 or capacitor 418 of an electrode element 406, with a single DAC 402 associated with a segment that can be connected to, or disconnected from, the DAC 402. In some embodiments, the filter switch 404 provides a single connection. The single connection may be a single filter leg 408 with a filter leg switch 410 and a filter portion, such as a resistor 412, in series between a first port 414 and a second port 416. The filter switch 404 may be connected at the first port to the DAC 402, either directly, or indirectly. The filter switch 404 may be connected at an other end, at the second port 416, to the electrode element 406, either directly or indirectly. The resistor 412 in the filter leg 408 permits the use of the capacitor 418 of the electrode element 406 in combination with the resistor 412 as a first order low pass filter, as the capacitor 418 is connected between the second port 416 and ground or other reference voltage.

The resistor 412 may be sized or configured to give a desired corner or cutoff frequency for the filter that is based on the capacitance of the capacitor 418. The capacitor 418 may be sized to provide the capacitance needed to maintain a charge that holds an appropriate voltage on the electrode 420. For example, the capacitor 418 may be configured so that it can be charged by the DAC 402 within a reasonable time, with a capacitance between about 1 picofarad (pF) and 1 nanofarad (nF), and in some embodiments, with a capacitance of about 10 pF. In such an embodiment, the resistor 412 may have a 20 kΩ, resistance, that, when used with, for example, a 10 pF capacitor 418, results in a corner or cutoff frequency of about 800 kHz using the formula $f_C=(1/(2\pi RC))$. Additionally, the resistors and capacitors may be sized and formed to avoid increasing noise or lowering noise performance. This is because the main purpose of the resistor and capacitor is to cause a soft phase or transition toward the equilibrium on both sides of the switch. Once both sides of the switch are in equilibrium, the low ohmic switch, or bypass leg can be opened, with the bypass leg used for the voltage ramps of a voltage profile because the RC-filter of the filter leg might slow the voltage changes of a voltage profile.

The filter leg 408 may also have a filter leg switch 410 that opens to disable the filter leg 408 or disconnect the filter leg 408 from the DAC 402. Thus, with only the filter leg 408 in the filter switch 404, the filter leg switch 410 disconnects the DAC 402 from the electrode element 406. In some embodiments, the filter leg switch 410 may be a solid state switch such as a complementary metal oxide semiconductor (CMOS) switch that may be used as an analog switch, or may be a single transistor, a relay or another type of switch.

Figure 4B:
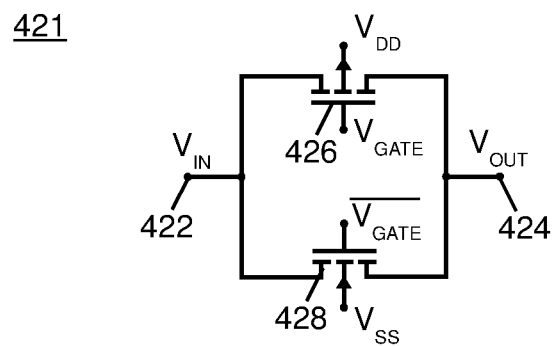
FIG. 4B is a diagram illustrating an analog switch according to some embodiments.

FIG. 4B is a diagram illustrating an analog switch 421 according to some embodiments. The analog switch 421 may have a first transistor 426 and a second transistor 428 in parallel between a first switch port 422 and a second switch poll 424. The first transistor 426 may be a first conduction type, such as an n-channel transistor, and the second transistor 428 may be a second conduction type different from the first conduction type, such as a p-channel transistor. Gates of the first transistor 426 and the second transistor 428 may be controlled by complimentary gate voltages so that both transistors 426, 428 turn on or turn off at the same time. Using complementary metal oxide semiconductor field effect transistors (MOSFETs) results in lower overall resistance across the analog switch 421 and more efficient switching than using a single transistor.

Figure 4C:
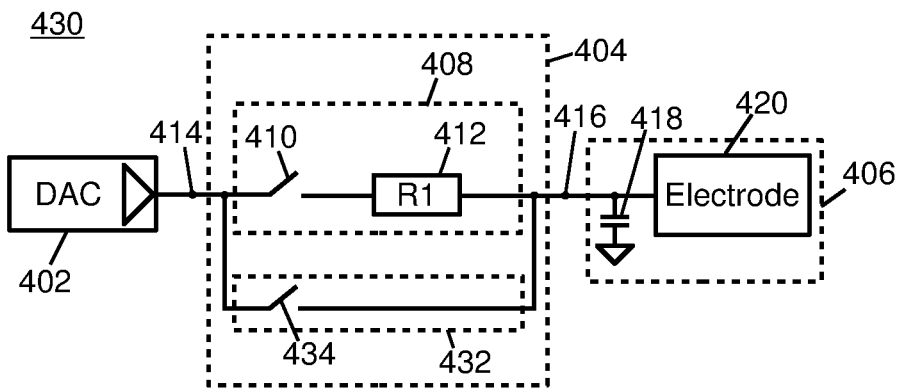
FIGS. 4C-4D are diagrams illustrating filtered switch systems with bypass legs according to some embodiments.
Figure 4D:
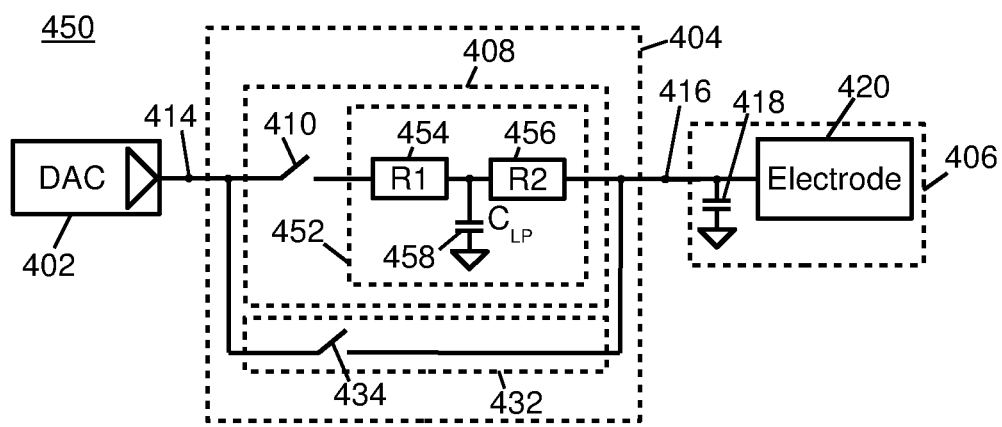

FIGS. 4C-4D are diagrams illustrating filtered switch systems with bypass legs according to some embodiments. FIG. 4C is a diagram illustrating a filtered switch system 430 with a bypass leg 432 according to some embodiments. The bypass leg 432 may be in parallel with the filter leg 408 between the first port 414 and the second port 416. The internal resistance of the filter leg switch, for example, where the filter leg switch 410 is a transistor, may be tuned to provide the resistance required to act as the resistor 412 for the filter to slow voltage transients of the DAC 402. Thus, a careful gate voltage control for a gate of the transistor may be used to control the filter leg switch 410 to slowly decrease the operating, or on, drain-source resistance ($R_{DS,on}$) of the filter switch 430. The bypass leg switch 434 may be subsequently closed to bypass the filter leg 408. In some embodiments, a filter switching control element may control the speed of closing of the filter leg switch 410, and then after some settling time or other time period, the filter switching control element may then close the bypass leg switch 434 to bypass the filter leg 408 and directly connect the first port 414 to the second port 416. Thus, the filter switch 430 provides "slow closing" of the filter switch 430 as well as a quick following of the segment voltage during the DAC 402 control, for example, during voltage ramps provided by the DAC 402.

The filter switching controller may provide a first switching control signal to the filter leg switch 410 causing the filter leg switch 410 to activate the filter leg 408 and connect the first port to the second port 416 though the filter leg 408 before the DAC 402 turns on or provides a DAC voltage. The filter switching controller may also provide a second filter switching control signal to the bypass leg switch 434 to connect the first port 414 directly to the second port 416 by bypassing the filter leg 408 after the filter leg 408 is activated and after the DAC 402 provides the DAC voltage.

FIG. 4D is a diagram illustrating a filtered switch system 450 with a bypass leg 432 and second order low pass filter provided by the filter leg 408 according to some embodiments. The second order low pass filter be formed from a second order filter portion 452 and the capacitor 418, and may have a first stage with a first resistor 454 and filter switch capacitor 458. The second order low pass filter may further have a second stage that is similar to the first order filter shown above, and may be formed from the capacitor 418 in the electrode element 406 and a second resistor 456 located between the first stage and the electrode element 406. Additionally, the resistors 454, 456 and filter switch capacitor 458 may be configured to provide a desired corner frequency in view of the capacitance of the capacitor 418. For example, the resistors 454, 456 may each have a 20 kΩ, resistance, and capacitors 458, 418 may each have a capacitance of about 10 pF. Thus, the first stage of the filter may have a cut-off frequency of about 800 kHz, and the elements of the second stage of filter may be selected to result in a cut-off frequency of about 800 kHz for the second state of the filter, so that a cut-off frequency for the overall second order filter of about 800 khz. The bypass leg 432 may be used to bypass the filter leg 408, or bypass at least at least the second order filter portion 452 by closing the bypass leg switch 434. The use of a second order filter permits greater filtering and control of the voltage rise during the closing of the filter switch system 450. Additionally, in some embodiments, the filter leg switch 410 may be a transistor, with the internal drain source resistance ($R_{DS,on}$) of the transistor switch replacing the first resistor 454. Thus, the drain-source resistance ($R_{DS,on}$) may be tuned provide the desired cutoff frequency and noise avoidance desired for the first stage of the filter. Furthermore, use of the transistor in place of the filter leg switch 410 and first resistor 454 permits fine control of the gate voltage of the transistor to slowly decrease the operating, or on, drain-source resistance of the filter switch 430 by providing a variable time constant for the filter, controlling the rate at which the transistor is turned on.

Figure 5A:
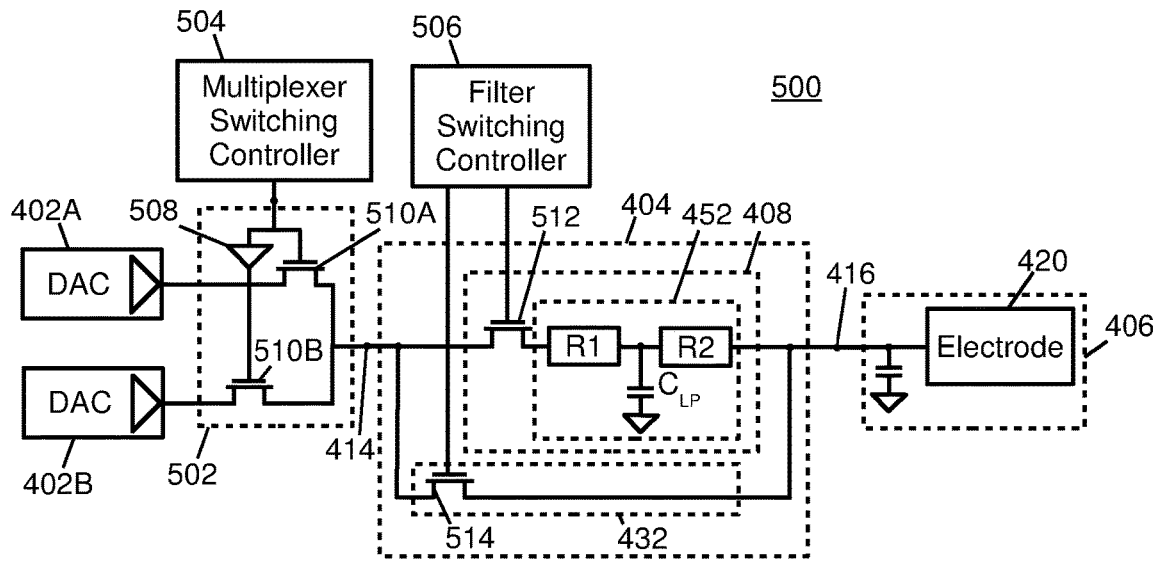
FIGS. 5A-5B are diagrams illustrating filtered switching systems for multiple DAC arrangements according to some embodiments.
Figure 5B:
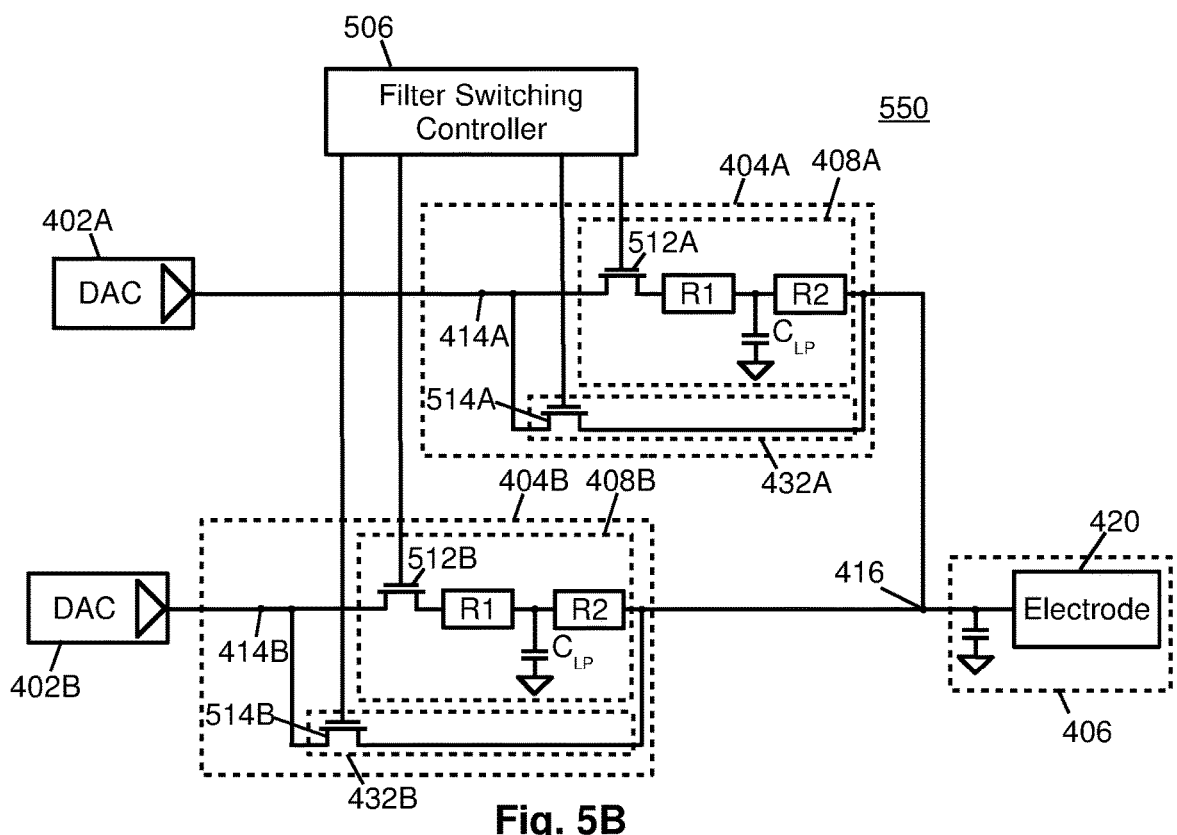

FIGS. 5A-5B are diagrams illustrating filtered switching systems for multiple DAC arrangements according to some embodiments. FIG. 5A is a diagram illustrating a system 500 with a multiplexer 502 and multiple DACs 402A, 402B according to some embodiments. While the switches 512, 514 in filter switch 404 are illustrated as transistors, the disclosed embodiments should not be interpreted as limiting, as the switches 512, 514 are shown as transistors for clarity, and the switches 512, 514 may be the CMOS switches discussed above, or may be another switch arrangement or configuration. Additionally, while the filter leg 408 is shown with a second order filter portion 452 forming a second order filter, other filters, such as a first order filter, third order filter, active filter, resistance-inductance-capacitance (RLC) filter, or another filter may be used.

Multiple DACs 402A, 402B may be connected to a multiplexer 502 that is controlled by a multiplexer switching controller 504. The multiplexer 502 may have an input for each DAC 402A, 402B and a single output connected to the first port 414. The multiplexer switching controller 504 provides control signals to multiplexer switches 510A, 510B to connect one of the DACs 402A, 402 to the first port, and to the filter switch 404. In some embodiments, the multiplexer 502 has one or more inverters 508 or NOT gates so that the multiplexer switching controller 504 can positively close or turn off one of the multiplexers switches 510A, 510B while opening or turning on another multiplexer switch 510A, 510B.

In some embodiments, the filter switch 404 is between the multiplexer 502 and the electrode element 406, and may be connected to the multiplexer 502 at a first port 414, and may be connected to the electrode element 406 at second port. Since the multiplexer 502 selects one of the DACs 402A, 402B for output to the filter switch 404 on a single line, the filter switch 404 only needs to handle a single input. Thus, in an embodiment where a filter switch 404 for multiple DACs 402A, 402B are connected to the DACs 402A, 402B through a multiplexer, the filter switch 404 has a filter leg 408 and a bypass leg 542 connecting the first port to the second port and the electrode element 406.

In some embodiments, a filter switching controller 506 sends filter switching control signal to switches 512, 514 of the filter switch 404. The filter switching controller 506 may be configured to receive a command to turn on the filter leg 408 by closing the filter leg switch 512, and then to turn on the bypass leg 432 by closing the bypass leg switch 434 after a predetermined time, settling time, or other time period. The filter switching controller 506 may provide a first switching control signal to the filter leg switch 512 causing the filter leg switch 512 to activate the filter leg 408 and connect the first port 414 to the second port 416 though the filter leg 408 before the DAC 402A, 402B turns on or provides a DAC voltage, and provide a second filter switching control signal to the bypass leg switch 514 to connect the first port 414 directly to the second port 416 by bypassing the filter leg 408 after the filter leg 408 is activated and after the DAC 402A, 402B provides the DAC voltage.

In some embodiments, the filter switching controller 506 may be a processor or similar computing device with a non-transitory computer readable medium that is integrated with, or is separate from, an ion movement control system in which a filter switch 404 is located. Alternatively, the filter switching controller 506 may be a dedicated circuit, such as an application specific integrated circuit (ASIC), a logic circuit, or other circuit that is in the ion movement control system, and may in some embodiments, be formed as part of an ion movement control system such as an ion shuttling system or TIQC control system. For example, the filter switching controller 506 may be formed on the same substrate as the ion movement control system, or may be formed on a separate substrate and mounted on, or otherwise electrically connected to, the substrate on which the ion movement control system is formed as a system-on-chip (SoC) structure, package, chip stack, or the like. However, forming the filter switching controller 506 on the ion movement control substrate permits the filter switching control 506 to be formed using the same processes or steps used to form the ion movement control system, filter switch 404, multiplexers 502, or DACs 402A, 402B.

In some embodiments, the filter switching controller 506 may be separate from the multiplexer switching control 504, permitting upgrading, replacement or maintenance of the filter switching controller 506 separately from any upgrades, replacement or maintenance of the multiplexer switching controller 504. In other embodiments, the filter switching controller 506 may be integrated into the multiplexer switching controller 504 or into another part of an electrode control element.

In some embodiments, software or circuitry in the filter switching controller 506 provides functionality for controlling switches 512, 514 in a filter switch 404. The filter switching controller 506 may receive a signal from an electrode control element or multiplexer switching control 504 indicating that an DAC will be turned on, either as an initial provision of a voltage to an electrode element 406, or as part of a change of DACs 402A, 402B providing the voltage to the electrode element 406. The filter switching controller 506 may then close or turn on a filter leg switch 512 to turn on or connect the filter leg 408 and cause a bypass leg switch 514 to open and turn off the bypass leg 432. In some embodiments, the filter leg-only connection may then be maintained for a predetermined time before the filter switching controller 506 controls the bypass switch 514 to close and connect the bypass leg 432 to bypass the filter leg 408. In other embodiments, the filter switching controller 506 may monitor a voltage at the first port 414, in the filter switch 404, or at another point in the circuit or ion movement control system to determine when the DAC 402A has set a voltage and the voltage has stabilized. Once the voltage has stabilized, the filter switching controller 506 may then connect the bypass leg 432. In yet other embodiments, the filter switching controller 506 may receive control signals indicating when to connect or disconnect the filter leg 408 and bypass leg 432. Additionally, in some embodiments, the filter switching controller 506 may optionally disconnect the filter leg 408 until filtering of a signal is needed again, and the disconnection of the filter leg 408 may be done automatically, or in response to a command from another system element in the filter switch system 500, or from an electrode control element, system controller or the like.

FIG. 5B is a diagram illustrating a system 550 with multiple DACs 402A, 402B and multiple filter switches 404A, 404B according to some embodiments. A first DAC 402A may be connected at a first switch port 414A to a first filter switch 404A with a first filter leg 408A controlled by a first filter leg switch 512A and with first bypass leg 532A controlled by a first bypass leg switch 514A. A second DAC 402B may be connected at a second switch port 414B to a second filter switch 404B with a second filter leg 408B controlled by a second filter leg switch 512B and with second bypass leg 532B controlled by a second bypass leg switch 514B. While not shown, additional filter switches and DACs may be provided, and the number is not limited.

The first filter switch 404A and second filter switch 404B may be provided in place of a multiplexer to effectively perform multiplexing or direct a voltage of a single DAC 402A, 402B to an electrode 420 of an electrode element 406. Thus, each DAC 402A, 402B may be selectively coupled to the electrode element 406 through the second port 416 by a respective filter switch 404A, 404B. In such an embodiment, the filter switching controller 506 may act as a multiplexer switching controller in addition to controlling the timing of the opening or closing of the filter leg switches 512A, 512B, 514A, 514B. The filter switching controller 506 selectively connects or disconnects each of the DACs 402A, 402B so that when one of the DACs 402A, 402B is connected to the electrode element 406, the other DAC 402B or DACs are disconnected from the electrode element 406.

Figure 6:
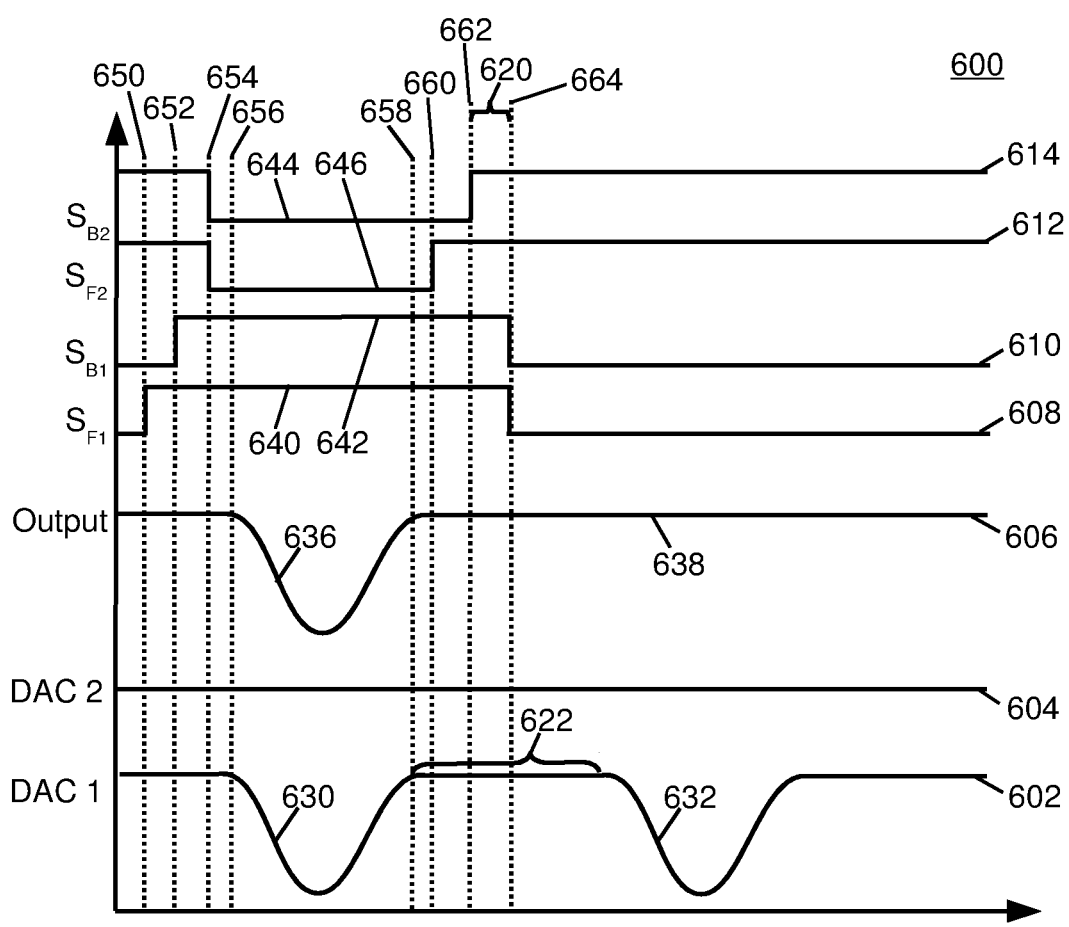
FIG. 6 is a diagram illustrating logical and voltage timings for filtered switches according to some embodiments.

FIG. 6 is a diagram illustrating logical and voltage timings 600 for filtered switches according to some embodiments. A first DAC (DAC 1) may provide a first DAC voltage 602 with, for example, one or more shuttling voltage profiles 630, 632, and a second DAC (DAC 2) may provide a second DAC voltage 604 with, for example, a keeping voltage profile. Switches in filter legs and bypass legs may be used to provide ZVS for switching between the first DAC voltage 602 and the second DAC voltage 604 to generate an output voltage 606. For illustrative purposes, the first DAC voltage is shown with a first voltage profile separated from a second voltage profile 632 by an interprofile voltage 622. Additionally, to illustrate the combination of the first DAC voltage 602 and second DAC voltage 604 to generate the output voltage 606, the second DAC voltage 604 is illustrated as a substantially constant voltage. However, it should be understood that any voltage profile may be used for either or both of the first DAC voltage 602 and the second DAC voltage 604.

The filter legs and bypass legs of the DACs DAC1, DAC2 permit a transition, in, for example, a transition phase 620, to transition the output voltage 606 from using the first DAC voltage 602 to using the second DAC voltage 604, and by slowing the switch between the first DAC voltage 602 provided by the first DAC DAC1 and the, transients that results from voltage different int the first DAC voltage 602 and the second DAC voltage 604 are damped, reduced or otherwise filtered. Using ZVS includes attempting to match the voltage of the first DAC voltage 602 to the voltage of the second DAC voltage, and connecting both the first DAC voltage 602 and the second DAC voltage 604 to the output during at least the transition phase 620. In order to avoid voltage jumps, even in the millivolt range on the segment or the output being provided to an electrode, the first DAC voltage 602 and second DAC voltage 604 may be held at substantially the same voltage for some time period, for example, during the transition phase 620. Additionally, the filtering or slowing provided by the filter leg slows the voltage transition when the respective DAC is initially connected to the output to further reduce the voltage jumps or sharpness of voltage transients during the transition between voltage source DACs.

A first filter leg switch ($S_{F1}$) may be controlled by a first filter switch leg control signal 608, a first bypass leg switch ($S_{B1}$) may be controlled by a first bypass switch leg control signal 610, a second filter leg switch ($S_{F2}$) may be controlled by a second filter switch leg control signal 612, and second bypass leg switch ($S_{B2}$) may be controlled by a second bypass leg switch control signal 614. Each of the leg switch control signals 608-614 may indicate that an associated switch is closed, or conducting.

In some embodiments, the digital control signals for repeated switching between DACs DAC1, DAC2 have some overlap where both DACs DAC1, DAC2 are connected to the output or segment. When the bypass switch of one DAC is closed, the switches on the other side can open, and there may be some delay, as fully closing the switches takes additional time. In embodiments where a transistor is used as a bypass switch or filter switch, the switch may suffer from charge injection where charge is ejected out of a source and drain of the transistor when the switch is opened. After a DAC is connected to the output, additional charge from opening the other DAC being turned off will cause an undesired voltage jump at the output. Therefore, fully closing the low-ohmic bypass leg for the newly connected DAC permits the charges to be ejected.

At a first turn-on time 650, $S_{F1}$ may be turned on with a first on pulse 640 when, or prior to, DAC 1 providing a voltage profile 630 or other voltage of interest so that the transition where the first DAC DAC1 is connected to the output is slowed or filtered when the first DAC voltage 602 is provided to an electrode. After the first DAC DAC1 is connected to the output, and after a settling time or delay, $S_{B1}$ may be turned on with a second on pulse 642 at a second turn-on time 652. This delay in turning on $S_{B1}$ permits the first DAC voltage 602 to settle, normalize or otherwise reach a steady state at the desired voltage level, so that when a bypass is provided by $S_{B1}$ between DAC 1 and the electrode element, unfiltered noise from connecting the first DAC DAC1 to the output is avoided through the output voltage 606 being provided to the electrode element.

Additionally, in the illustrated example, $S_{B1}$ and $S_{F1}$ are turned on while the second DAC DAC2 is connected to the output by $S_{B2}$ and $S_{F2}$ to illustrate transitioning from the second DAC DAC2 to the first DAC DAC1 providing the output voltage 606. However, the system may also be similarly used to turn on or connect a DAC, such as the first DAC DA1 when no other DAC is connected to the output, or when another DAC or element, are already connected to the output to provide the output voltage 606. In embodiments or examples where another voltage source is connected to the output, after $S_{B1}$ and $S_{F1}$ are turned on to connect the first DAC DAC1 to the output, the second bypass leg switch $S_{B2}$ may be turned off at a first turn-off time 654 with a first off pulse 644, and after the second bypass leg switch $S_{B2}$ is turned off, the second filter leg switch $S_{Fs}$ may be turned off at the first turn-off time 654. In other embodiments, the second bypass leg switch $S_{B2}$ may be turned off at a different time than the second filter leg switch $S_{F2}$, with both $S_{B2}$ and $S_{F2}$ being turned off after $S_{B1}$ and $S_{F2}$ are turned on.

Thus, when the first DAC DAC1 provides a first voltage profile 630, the first DAC DAC1 is connected to the output through the bypass leg since the first bypass switch $S_{B1}$ is closed, and the second DAC DAC2 is disconnected from the output since $S_{B2}$ and $S_{F2}$ are open. Additionally, since the first DAC DAC1 is connected to the output by the bypass leg due to $S_{B1}$ being closed, the voltage provided by the first DAC DAC1 bypasses the filter leg, so that $S_{F1}$ may remain closed or may be open. The bypass leg for the first DAC DAC1 is connected to the output by closing the first bypass $S_{B1}$ at the second turn-on time 652 before a first profile time 656 at which the first DAC DAC1 provides a first voltage profile 630. The filter leg and bypass leg for the second DAC DAC2 are also disconnected from the output before the first profile time so that the first DAC DAC1 provides the voltage source to the output. The bypass leg is connected to the output by the closed first bypass switch $S_{B1}$ until at least second profile time 658 when the first voltage profile 630 terminates.

When the output will be switched to be connected to a different DAC such as the second DAC DAC2, the second DAC DAC2 may be connected to the output and the first DAC DAC1 is disconnected from the output. In some embodiments, the second filter leg is connected to the output by closing the second filter switch $S_{F2}$ at a third turn-on time 660, and subsequently connecting the second bypass leg to the output by closing the second bypass switch $S_{B2}$. $S_{B2}$ may be closed at a fourth turn-on time 662 and after $S_{F2}$ is turned on to allow for the voltage provided by the second DAC DAC2 to settle, with the filter leg slowing the transition when the second DAC DAC2 voltage is connected. This reduces the effect of any voltage jump caused by a mismatch in the voltages between the first DAC aDAC1 and the second DAC DAC2 that that is introduced by the connection of the second DAC DAC2 to the output.

At a second turn-off time 664, the first DAC DAC1 may be disconnected from the output by turning off both the first bypass switch $S_{B1}$ and the first filter switch $S_{F1}$. The second turn-off time 664 may be after the third turn-on time 660 and the fourth turn-on time 662 to provide the transition phase 620 where both the first DAC DAC1 and the second DAC DAC2 are connected to the output, allowing charge to drain from the transistors used for switches and preventing charge injection from the second bypass leg switch $S_{B2}$ and second filter switch $S_{F2}$ as result of those switches $S_{B2}$, $S_{F2}$ being closed. After the second turn-off time 664, open the second DAC DAC2 is connected to the output, and the output voltage 606 follows the second DAC voltage 604. Thus, the output voltage may have a first voltage portion 636 that follows the first DAC voltage 604 and a second voltage portion 638 that follows the second DAC voltage 604.

Additionally, while FIG. 6 illustrates the timing the leg switch control signals 608-614 controlling the first DAC DAC1 and second DAC DAC2 to both be connected to the electrode during at least the transition time 620 between the fourth turn on time 662 and second turn-off time 664, or between either the first or second turn-on times 650, 652 and the first turn-off time 654, the circuit is not necessarily limited to such an arrangement, as the timing of the connections between the first DAC DAC1 and the electrode element, or the second DAC DAC2 and the electrode element may be adjusted to suit the needs of the specific circuit. For example, in some embodiments, where second DAC DAC2 is being connected to the electrode and the first DAC DAC1 being disconnected from the electrode, the first turn-off time 654 may be about the same as the first turn on-time 650, resulting in the second DAC DAC2 being disconnected from the electrode about the same time that the first DAC DAC 1 is connected to the electrode though the first filter leg by closing the first filter leg switch $S_{F1}$. In another example embodiment, the first turn-off time 654 may be about the same as the second turn on-time 652, resulting in the second DAC DAC2 being disconnected from the electrode about the same time that the first DAC DAC 1 is connected to the electrode though the first bypass leg by closing the first filter leg switch $S_{B1}$, and after the first DAC DAC 1 is connected to the electrode through the first filter leg at the first turn-on time 650. In yet another example embodiment, the first turn-off time 654 may be between the first turn-on time 650 and the second turn on-time 652, resulting in the second DAC DAC2 being disconnected from the electrode after the first DAC DAC 1 is connected to the electrode though the first filter leg by closing the first filter leg switch $S_{F1}$, and the second DAC DA2 being disconnected from the electrode before the first DAC DAC1 is connected to the electrode though the first bypass leg by closing the first filter leg switch $S_{B1}$. Therefore, the second DAC DAC2 would be disconnected while the first DAC DAC 1 is connected to the electrode by only the first filter leg. Similarly, the first DAV DAC 1 may be disconnected from the electrode by opening the first bypass leg switch $S_{B1}$ and first filter leg switch $S_{F1}$ at the same time (third turn-on time 660) as the second filter switch $S_{F2}$ is closed to connect the second DAC DAC2 though the second filter leg, or at about the same time (fourth turn-on time 662) the second bypass leg switch $S_{B2}$ is closed to connect the second DAC DAC2 through the second bypass leg, or between the times (between the third turn-on time 660 and the forth turn-on time 662) that the second filter leg switch $S_{F2}$ and the second bypass leg switch $S_{B2}$ is close to connect the second DAC DAC2 to the electrode.

Figure 7:
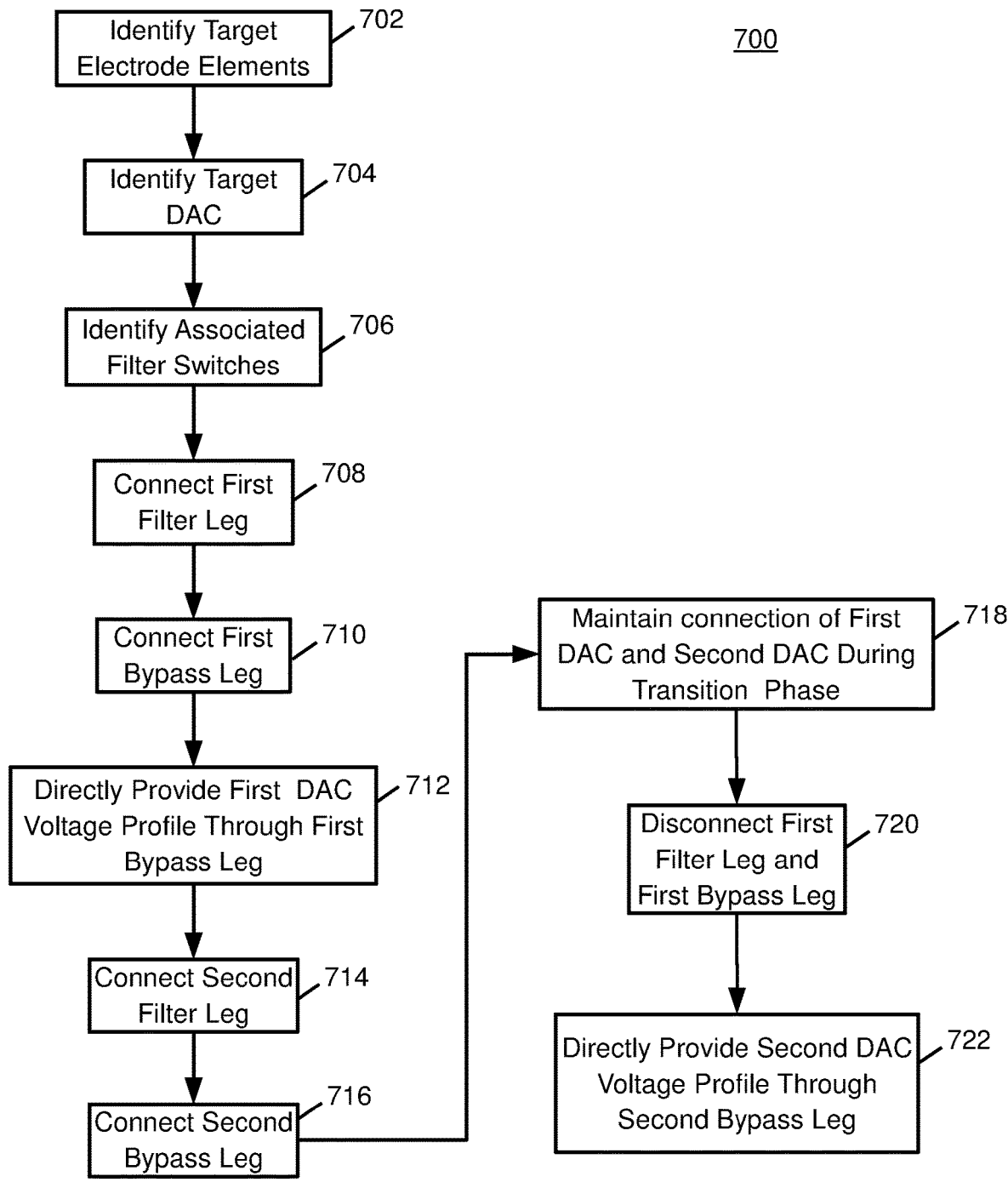
FIG. 7 is a flow diagram illustrating a method for providing filtered switching for ion movement control according to some embodiments.

FIG. 7 is a flow diagram illustrating a method 700 for providing filtered switching for ion movement control according to some embodiments. In block 702, target electrode elements are identified. In some embodiments, a system element such as a system controller, shuttling controller, data handling element, electrode control, filter switching system, or the like determine which electrodes or electrode elements need to have a voltage set. In block 704, one or more target DACs are identified. In some embodiments, a system element determines which DAC should be used to provide the required voltages or voltage profiles to the identified target electrode element. A first DAC may be a DAC that is currently providing the required voltage or voltage profile, an unused DAC, or a DAC that will not be used at the time the voltage needs to be provided to the electrode element.

In block 706, one or more associated filter switches are identified. In embodiments where the system foregoes a multiplexer in favor of filter switches that control which electrodes get a voltage from a particular DAC, or where each DAC has an associated filter switch, the filter switch may be associated with an identified first DAC or the identified target electrode element. In other embodiments where a filter switch is associated with an output of a multiplexer, the system may identify a multiplexer that will be used to connect a first DAC to an identified target electrodes, and identify the first filter switch for the identified multiplexer as the associated filter switch.

In block 708, the first filter leg of the associated filter switch is connected. In some embodiments, a filter switch controller or other system element provides a signal to connect or activate a transistor or otherwise connect a filter leg switch of a first filter leg of the associated filter to connect the selected first DAC to the electrode element though a filter of the first filter leg. The first DAC voltage, in some embodiments, may be provided by setting a voltage at the first DAC in response to a command from a system controller, or other system element, causing the first DAC to set or change a voltage, by a multiplexer or other switching system connecting first DAC with an already set voltage to the filter switch, or the like. Thus, providing the first DAC voltage through the first filter leg results in providing a filtered DAC voltage to the electrode element.

In block 710, the first bypass leg of the of the associated filter switch is connected. While the first DAC voltage is provided, and after a settling or delay time period starting from the time the first filter leg is connected, the first bypass leg connects the first DAC to the target electrode elements to provide a short circuit path or bypass around the first filter leg. Accordingly, in block 712, the DAC voltage profile is provided directly through the bypass legs. Thus, providing the DAC voltage though the bypass leg results in providing an unfiltered DAC voltage to the electrode elements, and the filtered DAC voltage may be transitioned to an unfiltered DAC voltage without disconnecting the DAC from the electrode element.

After the first DAC voltage profile is provided through the first bypass leg in block 712, a second DAC may be connected to the electrode element to control or change the output voltage provided to the electrode element. Thus, in block 714, and after the first DAC voltage profile is provided through the first bypass leg in block 712, a second filter leg may be connected to connect a second DAC to the electrode element. In some embodiments, the second DAC voltage may be substantially the same as the first DAC voltage, to provide ZVS. Connecting the second DAC to the electrode element though the filter leg slows the transition from the first DAC voltage at the electrode element to the second DAC voltage. After a settling time, in block 716, a second bypass leg may be connected to directly connect the second DAC to the electrode element. In block 718, the connection of the first DAC to the electrode element is maintained during a transition phase while the second DAC is connected to the electrode element. The transition phase may be used to allow excess charge to drain from transistors or switches in the filter legs and bypass legs to avoid charge injection during disconnection of the switches.

In block 720, the first bypass leg and the first filter leg are disconnected. The first bypass leg and first filter leg are disconnected after the transition phase, and disconnection of the first bypass leg and first filter leg disconnect the first DAC from the electrode element, resulting in the second DAC solely providing a second DAC voltage to electrode element. In some embodiments, a system element provides a signal that causes switches or transistors in the first bypass leg and in the first filter leg to open, disconnect, or deactivate. In block 722, the second DAC voltage is provided directly through the second bypass leg, as the first DAC is disconnected from the electrode element.

While a single iteration of the filter switching process is shown here, multiple DAC filter switching processes may take place sequentially, or semi-simultaneously, as described above, with a second iteration of the method staring using different DACs for the identified target electrodes, for example, after the bypass leg is disconnected in block 716 in a first iteration of the method. Thus, different DAC processes may be performed in overlapping fashion in a same electrode element.

An embodiment apparatus includes a digital to analog converter (DAC) connected to a first port and having circuitry enabled to provide a DAC voltage, an electrode element connected to a second port, the electrode element configured to provide, according to a supplied DAC voltage, an electrical field for controlling a position of an ion, and a filter switch connected between the first port and the second port and having a filter leg and a bypass leg, the filter leg located between the first port and the second port, where the bypass leg is between the first port and the second port in parallel with the filter leg, where the filter leg has a filter leg switch and a filter portion in series between the first port and the second port and is configured to selectively couple the first port through the filter leg to the second port to slow a voltage transient of the DAC voltage to provide a filtered DAC voltage as the supplied DAC voltage to the electrode element, and where the bypass leg has a bypass leg switch between the first port and the second port and is configured to selectively couple the first port directly to the second port provide the DAC voltage as the supplied DAC voltage to the electrode element.

In some embodiments, the filter portion includes a first resistor, where the electrode element includes a capacitor and an electrode, and where the first resistor and the capacitor form a first order resistor-capacitor (RC) filter. In some embodiments, the filter portion includes a first resistor, a second resistor and a leg capacitor, where the electrode element includes an electrode capacitor and an electrode, and where the first resistor, the second resistor, the leg capacitor and the electrode capacitor form a second order resistor-capacitor (RC) filter. In some embodiments, the apparatus further has a filter switching controller having circuitry enabled to provide at least one switching control signal, where a first switching control signal of the at least one switching control signal causes the filter leg switch to close, and where closing of the filter leg switch causes the filter leg switch to connect the first port to the second port though the filter leg and connect the DAC to the electrode through the filter. In some embodiments, a second switching control signal of the at least one switching control signal causes the bypass leg switch to close after the filter leg switch closes. In some embodiments, a third switching control signal of the at least one switching control signal causes the bypass leg switch to open after the DAC voltage provides a voltage profile, where the bypass leg is closed during provision of the voltage profile. In some embodiments, the apparatus further includes a multiplexer between the DAC and the filter switch, where the multiplexer is configured to selectively connect the DAC to the first port according to a control signal from a multiplexer switching controller. In some embodiments, the multiplexer has a plurality of inputs connected to a plurality of DACs, including the DAC, where the multiplexer is configured to selectively connect a selected DAC of the plurality of DACs to the first port, where the filter switch leg and the bypass leg are configured to selectively connect the selected DAC to the second port.

An embodiment apparatus includes a plurality of digital to analog converters (DACs), each DAC of the plurality of DACs having circuitry enabled to provide a respective DAC voltage according to a digital voltage signal from a DAC register, an electrode element including an electrode and a capacitor connected to a port, where the capacitor is connected between the port and a reference voltage, and where the electrode element configured to provide, according to a supplied DAC voltage, an electrical field for controlling movement of an ion, and a first filter switch having a first filter leg connected between a first DAC of the plurality of DACs and the electrode, where the first filter leg has a first filter leg switch in series with a first filter portion, where the first filter portion and the capacitor form a first filter between the first DAC and the electrode, where the first filter leg switch is configured to selectively couple the first DAC through the first filter leg to the electrode, where the first filter is configured to slow a voltage transient of the DAC voltage to provide a filtered first DAC voltage as the supplied DAC voltage to the electrode.

In some embodiments, the first filter switch further has a first bypass leg connected between the first DAC and the electrode in parallel with the first filter leg, where the first bypass leg has a first bypass leg switch and is configured to selectively couple the first DAC to the electrode to provide the first DAC voltage as the supplied DAC voltage to the electrode. In some embodiments, the apparatus further includes a multiplexer between the plurality of DACs and the first filter switch, where the multiplexer is configured to selectively connect each DAC of the plurality of DACs to the first filter switch, and where the multiplexer is further configured to connect a selected DAC of the plurality of DACs to the first filter switch according to a control signal from a multiplexer switching controller. In some embodiments, the apparatus further incudes a second filter switch having a second filter leg connected between a second DAC of the plurality of DACs, where the second filter leg has a second filter leg switch in series with a second filter portion, where the second filter portion and the capacitor form a second filter between the second DAC and the electrode, where the second filter leg switch is configured to selectively couple the second DAC through the second filter leg to the electrode, where the second filter is configured to filter a second DAC voltage provided by the second DAC and provide a filtered second DAC voltage as the supplied DAC voltage to the electrode, where the second filter switch further has a second bypass leg connected between the second DAC and the electrode in parallel with the second filter leg, where the second bypass leg has a second bypass leg switch and is configured to selectively couple the second DAC to the electrode to provide the second DAC voltage, without filtering, as the supplied DAC voltage to the electrode. In some embodiments, the apparatus further includes a filter switching controller having circuitry enabled to provide switching control signals that control the first filter leg switch, the first bypass leg switch, the second filter leg switch and the second bypass leg switch to selectively connect only one of the first DAC or the second DAC to the electrode during a first time period, and to selectively connect both the first DAC and the second DAC to the electrode during a second time period. In some embodiments, the apparatus further includes a filter switching controller having circuitry enabled to provide switching control signals that control the first filter leg switch, the first bypass leg switch, the second filter leg switch and the second bypass leg switch to connect both the first DAC and the second DAC to the electrode during a transition phase while switching between connecting the first DAC and the second DAC to the electrode and while the first DAC voltage and the second DAC voltage are substantially the same.

An embodiment method includes providing a first digital to analog converter (DAC) voltage through a filter leg for a first time period to an electrode element of an ion position control element, providing, to the electrode element, for a second time period immediately after the first time period, the first DAC voltage through an unfiltered leg that is in parallel with the filter leg, and controlling movement of an ion through an electrical field provided at an electrode of the electrode element according to the first DAC voltage provided to the electrode element.

In some embodiments, the filter leg is located between the first DAC and an electrode of the electrode element, and the unfiltered leg is a first bypass leg disposed between the first DAC and the electrode, where the filter leg includes a filter leg switch and a filter portion having a resistor, where at least the resistor and a capacitor of the electrode element form a resistor-capacitor (RC) filter. In some embodiments, providing the first DAC voltage through the filter leg for a first time period includes causing the filter leg switch to close by providing, by a filter switching controller, a first switching control signal, where closing of the filter leg switch causes the filter leg switch to connect the first DAC to the electrode though the filter and to slow a voltage transition of the first DAC voltage. In some embodiments, providing, for a second time period immediately after the first time period, the first DAC voltage through the unfiltered leg includes causing a bypass leg switch of the first bypass leg to connect the first DAC to the electrode element while a second DAC voltage is provided to the electrode element, by a second DAC through a second bypass leg, where the first DAC voltage is substantially the same as the first DAC voltage. In some embodiments, the method further includes providing, for a third time period after the second time period, by a second DAC, through a second bypass leg, a second DAC voltage to the electrode element. In some embodiments, providing the first DAC voltage through the filter leg for a first time period to the electrode element includes selectively connecting, by a multiplexer, the first DAC to the electrode element according to a control signal at the multiplexer from a multiplexer switching controller.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus, comprising:
a digital to analog converter (DAC) connected to a first port and having circuitry enabled to provide a DAC voltage;
an electrode element connected to a second port, the electrode element configured to provide, according to a supplied DAC voltage, an electrical field for controlling a position of an ion; and
a filter switch connected between the first port and the second port and having a filter leg and a bypass leg, wherein the filter leg is located between the first port and the second port and wherein the bypass leg is between the first port and the second port in parallel with the filter leg, wherein the filter leg has a filter leg switch and a filter portion in series between the first port and the second port and is configured to selectively couple the first port through the filter leg to the second port to slow a voltage transient of the DAC voltage to provide a filtered DAC voltage as the supplied DAC voltage to the electrode element, and wherein the bypass leg has a bypass leg switch between the first port and the second port and is configured to selectively couple the first port directly to the second port provide the DAC voltage as the supplied DAC voltage to the electrode element.

2. The apparatus of claim 1, wherein the filter portion comprises a first resistor, wherein the electrode element comprises a capacitor and an electrode, and wherein the first resistor and the capacitor form a first order resistor-capacitor (RC) filter.

3. The apparatus of claim 1, wherein the filter portion comprises a first resistor, a second resistor and a leg capacitor, wherein the electrode element comprises an electrode capacitor and an electrode, and wherein the first resistor, the second resistor, the leg capacitor and the electrode capacitor form a second order resistor-capacitor (RC) filter.

4. The apparatus of claim 1, further comprising a filter switching controller having circuitry enabled to provide at least one switching control signal, wherein a first switching control signal of the at least one switching control signal causes the filter leg switch to close, and wherein closing of the filter leg switch causes the filter leg switch to connect the first port to the second port though the filter leg and connect the DAC to the electrode element through the filter.

5. The apparatus of claim 4, wherein a second switching control signal of the at least one switching control signal causes the bypass leg switch to close after the filter leg switch closes.

6. The apparatus of claim 5, wherein a third switching control signal of the at least one switching control signal causes the bypass leg switch to open after the DAC voltage provides a voltage profile, wherein the bypass leg is closed during provision of the voltage profile.

7. The apparatus of claim 5, further comprising a multiplexer between the DAC and the filter switch, wherein the multiplexer is configured to selectively connect the DAC to the first port according to a control signal from a multiplexer switching controller.

8. The apparatus of claim 7, wherein the multiplexer has a plurality of inputs connected to a plurality of DACs, including the DAC, wherein the multiplexer is configured to selectively connect a selected DAC of the plurality of DACs to the first port, wherein the filter leg and the bypass leg are configured to selectively connect the selected DAC to the second port.

9. An apparatus comprising:
a plurality of digital to analog converters (DACs), each DAC of the plurality of DACs having circuitry enabled to provide a respective DAC voltage according to a digital voltage signal from a DAC register;
an electrode element comprising an electrode and a capacitor connected to a port, wherein the capacitor is connected between the port and a reference voltage, and wherein the electrode element configured to provide, according to a supplied DAC voltage, an electrical field for controlling movement of an ion; and
a first filter switch having a first filter leg connected between a first DAC of the plurality of DACs and the electrode, wherein the first filter leg has a first filter leg switch in series with a first filter portion, wherein the first filter portion and the capacitor form a first filter between the first DAC and the electrode, wherein the first filter leg switch is configured to selectively couple the first DAC through the first filter leg to the electrode, wherein the first filter is configured to slow a voltage transient of the DAC voltage to provide a filtered first DAC voltage as the supplied DAC voltage to the electrode.

10. The apparatus of claim 9, wherein the first filter switch further has a first bypass leg connected between the first DAC and the electrode in parallel with the first filter leg, wherein the first bypass leg has a first bypass leg switch and is configured to selectively couple the first DAC to the electrode to provide the first DAC voltage as the supplied DAC voltage to the electrode.

11. The apparatus of claim 10, further comprising a multiplexer between the plurality of DACs and the first filter switch, wherein the multiplexer is configured to selectively connect each DAC of the plurality of DACs to the first filter switch, and wherein the multiplexer is further configured to connect a selected DAC of the plurality of DACs to the first filter switch according to a control signal from a multiplexer switching controller.

12. The apparatus of claim 10, further comprising:
a second filter switch having a second filter leg connected between a second DAC of the plurality of DACs, wherein the second filter leg has a second filter leg switch in series with a second filter portion, wherein the second filter portion and the capacitor form a second filter between the second DAC and the electrode, wherein the second filter leg switch is configured to selectively couple the second DAC through the second filter leg to the electrode, wherein the second filter is configured to filter a second DAC voltage provided by the second DAC and provide a filtered second DAC voltage as the supplied DAC voltage to the electrode;
wherein the second filter switch further has a second bypass leg connected between the second DAC and the electrode in parallel with the second filter leg, wherein the second bypass leg has a second bypass leg switch and is configured to selectively couple the second DAC to the electrode to provide the second DAC voltage as the supplied DAC voltage to the electrode.

13. The apparatus of claim 12, further comprising a filter switching controller having circuitry enabled to provide switching control signals that control the first filter leg switch, the first bypass leg switch, the second filter leg switch and the second bypass leg switch to selectively connect only one of the first DAC or the second DAC to the electrode during a first time period, and to selectively connect both the first DAC and the second DAC to the electrode during a second time period.

14. The apparatus of claim 12, further comprising a filter switching controller having circuitry enabled to provide switching control signals that control the first filter leg switch, the first bypass leg switch, the second filter leg switch and the second bypass leg switch to connect both the first DAC and the second DAC to the electrode during a transition phase while switching between connecting the first DAC and the second DAC to the electrode and while the first DAC voltage and the second DAC voltage are substantially the same.

15. A method, comprising:
providing a first digital to analog converter (DAC) voltage through a filter leg for a first time period to an electrode element of an ion position control element;
providing, to the electrode element, for a second time period immediately after the first time period, the first DAC voltage through an unfiltered leg that is in parallel with the filter leg; and
controlling movement of an ion through an electrical field provided at an electrode of the electrode element according to the first DAC voltage provided to the electrode element.

16. The method of claim 15, wherein the filter leg is located between the first DAC and an electrode of the electrode element, and wherein the unfiltered leg is a first bypass leg disposed between the first DAC and the electrode, wherein the filter leg comprises a filter leg switch and a filter portion having a resistor, wherein at least the resistor and a capacitor of the electrode element form a resistor-capacitor (RC) filter.

17. The method of claim 16, wherein the providing the first DAC voltage through the filter leg for a first time period comprises causing the filter leg switch to close by providing, by a filter switching controller, a first switching control signal, wherein closing of the filter leg switch causes the filter leg switch to connect the first DAC to the electrode though the filter and to slow a voltage transition of the first DAC voltage.

18. The method of claim 16, wherein the providing, for the second time period immediately after the first time period, the first DAC voltage through the unfiltered leg comprises causing a bypass leg switch of the first bypass leg to connect the first DAC to the electrode element while a second DAC voltage is provided to the electrode element, by a second DAC through a second bypass leg, wherein the first DAC voltage is substantially the same as the second DAC voltage.

19. The method of claim 16, further comprising providing, for a third time period after the second time period, by a second DAC, through a second bypass leg, a second DAC voltage to the electrode element.

20. The method of claim 16, wherein the providing the first DAC voltage through the filter leg for a first time period to the electrode element comprises selectively connecting, by a multiplexer, the first DAC to the electrode element according to a control signal at the multiplexer from a multiplexer switching controller.

* * * * *